(12) United States Patent
Yamazaki

(10) Patent No.: US 7,583,020 B2
(45) Date of Patent: Sep. 1, 2009

(54) LIGHT-EMITTING DEVICE, FILM-FORMING METHOD AND MANUFACTURING APPARATUS THEREOF, AND CLEANING METHOD OF THE MANUFACTURING APPARATUS

(75) Inventor: Shunpei Yamazaki, Tokyo (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 959 days.

(21) Appl. No.: 10/732,807

(22) Filed: Dec. 11, 2003

(65) Prior Publication Data
US 2005/0016462 A1    Jan. 27, 2005

(30) Foreign Application Priority Data
Dec. 12, 2002 (JP) ............................. 2002-361320
Dec. 27, 2002 (JP) ............................. 2002-379235

(51) Int. Cl.
*H01L 51/54* (2006.01)

(52) U.S. Cl. ................ 313/504; 313/506; 428/690; 428/917

(58) Field of Classification Search .................. None
See application file for complete search history.

(56) References Cited

U.S. PATENT DOCUMENTS

| 4,987,851 | A | | 1/1991 | Yasuda et al. | |
|---|---|---|---|---|---|
| 5,039,561 | A | | 8/1991 | Debe | |
| 5,281,489 | A | * | 1/1994 | Mori et al. | 428/690 |
| 5,501,739 | A | | 3/1996 | Yamada et al. | |
| 5,650,013 | A | | 7/1997 | Yamazaki | |
| 5,783,292 | A | * | 7/1998 | Tokito et al. | 428/212 |
| 5,817,578 | A | | 10/1998 | Ogawa | |
| 5,863,338 | A | | 1/1999 | Yamada et al. | |
| 5,895,932 | A | | 4/1999 | Bojarczuk, Jr. et al. | 257/103 |
| 5,898,185 | A | | 4/1999 | Bojarczuk, Jr. et al. | 257/103 |
| 5,989,945 | A | | 11/1999 | Yudasaka et al. | |
| 6,104,462 | A | | 8/2000 | Kurosaki et al. | |
| 6,106,627 | A | | 8/2000 | Yializis | |
| 6,114,055 | A | * | 9/2000 | Choong et al. | 428/690 |
| 6,150,536 | A | | 11/2000 | Chondroudis et al. | 549/2 |
| 6,179,923 | B1 | | 1/2001 | Yamamoto et al. | |
| 6,271,498 | B1 | | 8/2001 | Miyake et al. | |
| 6,290,563 | B1 | | 9/2001 | Codama et al. | |
| 6,294,025 | B1 | | 9/2001 | Kinder | |
| 6,337,102 | B1 | | 1/2002 | Forrest et al. | |
| 6,340,501 | B1 | | 1/2002 | Kamiyama et al. | |
| 6,544,488 | B1 | | 4/2003 | Fukuda | |
| 6,776,847 | B2 | | 8/2004 | Yamazaki et al. | |
| 7,316,983 | B2 | | 1/2008 | Yamazaki et al. | |
| 7,432,116 | B2 | | 10/2008 | Yamazaki et al. | |
| 2001/0006827 | A1 | | 7/2001 | Yamazaki et al. | |
| 2001/0009154 | A1 | | 7/2001 | Nguyen et al. | |
| 2002/0009538 | A1 | | 1/2002 | Arai | 427/66 |
| 2002/0011205 | A1 | | 1/2002 | Yamazaki et al. | |
| 2002/0139303 | A1 | | 10/2002 | Yamazaki et al. | 118/719 |
| 2003/0124764 | A1 | | 7/2003 | Yamazaki et al. | 438/99 |
| 2005/0029931 | A1 | * | 2/2005 | King et al. | 313/504 |
| 2008/0081115 | A1 | | 4/2008 | Yamazaki et al. | |

FOREIGN PATENT DOCUMENTS

| EP | 1 319 732 A1 | 6/2003 |
|---|---|---|
| JP | 61-030661 | 2/1986 |
| JP | 61-235553 | 10/1986 |
| JP | 04-236759 | 8/1992 |
| JP | 05-243185 | 9/1993 |
| JP | 07-062526 | 3/1995 |
| JP | 9-328680 | 12/1997 |
| JP | 10-168559 | 6/1998 |
| JP | 10-294181 | 11/1998 |
| JP | 11-307258 | 11/1999 |
| JP | 2000-48962 | 2/2000 |
| JP | 2000-68067 | 3/2000 |
| JP | 2000-282219 | 10/2000 |
| JP | 2000-328229 | 11/2000 |
| JP | 2001-149877 | 6/2001 |
| JP | 2001-196178 | 7/2001 |
| JP | 2001-267073 | 9/2001 |
| JP | 2001-291582 | 10/2001 |
| JP | 2002-33190 | 1/2002 |
| JP | 2002-302757 | 10/2002 |
| JP | 2003-313654 | 11/2003 |

OTHER PUBLICATIONS

Machine-assisted translation of JP 09-328680 (Dec. 1997).*
Partial International Search Report of Application No. PCT/JP03/15617 dated Jan. 27, 2004 (4 pages).
International Preliminary Examination Report dated Jul. 20, 2004 of counterpart application No. PCT/JP03/15617; 8 pages with partial translation.
International Search Report in Japanese (Application No. PCT/JP03/15617), Mar. 16, 2004, 3 pages.
Chinese Office Action (Application No. 200380105723.8) dated Mar. 21, 2008 with English translation.

* cited by examiner

*Primary Examiner*—Marie R. Yamnitzky
(74) *Attorney, Agent, or Firm*—Fish & Richardson P.C.

(57) ABSTRACT

This invention provides a new film forming method in which, on the occasion that pressure is decreased by pressure decreasing means which was connected to a film forming chamber, and a film is formed by evaporating an organic compound material from a deposition source in the film forming chamber, minute amounts of gas (silane series gas) which comprises smaller particles than particles of the organic compound material, i.e., a material with a smaller atomic radius are flowed, and the material with a small atomic radius is made to be included in an organic compound film.

30 Claims, 14 Drawing Sheets

(A) SETTING (B) DISMOUNTING CONTAINER (A) TOP VIEW (B) PERSPECTIVE VIEW

LIGHT-EMITTING DEVICE, FILM-FORMING METHOD AND MANUFACTURING APPARATUS THEREOF, AND CLEANING METHOD OF THE MANUFACTURING APPARATUS

TECHNICAL FIELD

This invention relates a film forming apparatus, a manufacturing apparatus, a cleaning method, and a film forming method, which are used for film formation of a material which can be formed as a film by deposition (hereinafter, referred to as a deposition material). In particular, this invention is a technology which is effective in case of using a material which includes an organic compound, as a deposition material.

BACKGROUND ART

In recent years, research of a light emitting apparatus which used an EL device as a self-luminous type device has been intensified, and in particular, a light emitting apparatus which used an organic material as the EL material has been attracting attention. This light emitting apparatus is also called as an organic EL display or an organic light emitting diode.

A light emitting apparatus has such a characteristic that there is no problem of a view field angle since it is of a self-luminous type, unlike a liquid crystal display apparatus. That is, as a display which is used out of doors, it is more suitable than a liquid crystal display, and uses in various forms have been proposed.

An EL device is of such a configuration that an EL layer was sandwiched between a pair of electrodes, and the EL layer is normally of a laminated configuration. Representatively, a laminated configuration of "a hole transport layer/a light emitting layer/an electron transport layer" is cited. This configuration is of very high luminous efficiency, and most of the light emitting apparatuses, for which researches and developments have been advanced at present, adopt this configuration.

The biggest problem in a practical application of an EL device is on such a point that life of the device is insufficient. Also, deterioration of the device appears in such a form that a non-luminous region (dark spot) is broadened as it is made to emit light for a long time, and as its cause, deterioration of the EL layer has become an issue.

An EL material, which forms the EL layer, is deteriorated by impurities such as oxygen and water. In addition, it is also conceivable that other impurities are included in the EL material, which has an effect on deterioration of the EL layer.

In addition, the EL material is broadly classified into a low molecular series (monomer series) material and a high molecular series (polymer series) material, and the low molecular series material among these is formed as a film, mainly by deposition. A vacuum deposition method in which a film is formed by evaporating an evaporation material from an evaporation source in vacuum is known as a representative example of a physical film forming method. In addition, as a representative example of a chemical film forming method, known is CVD (Chemical Vapor Deposition) in which a film is formed by supplying gas as material over a substrate and chemical reaction in gaseous phase or over the substrate surface.

On the occasion of carrying out film formation by a conventional deposition method, an evaporation material is used as it is, but it is conceivable that an impurity is mixed in an evaporation material at the time of deposition. That is, there is such a possibility that oxygen, water and another impurity, which is one of deterioration causes of an EL device, are mixed in.

In addition, it is possible to heighten purity by having purified an evaporation material in advance, but there is also such a possibility that an impurity is mixed in during a period until it is evaporated.

An EL material is very easily deteriorated, and it is easily oxidized and deteriorated due to existence of oxygen or water. On that account, it is impossible to carry out a photolithography process after film formation, and in order to develop a certain pattern, there is such a necessity that a mask having an opening part (hereinafter, referred to as a deposition mask) is used and it is separated at the same time as film formation. Therefore, most of the sublimed organic EL materials are attached to a deposition mask or an anti-attachment shield (a protection plate for preventing an evaporation material from being attached to an inner wall of a film forming chamber) in a film forming chamber.

DISCLOSURE OF THE INVENTION (Problem that the Invention is to Solve)

This invention is a thing which was made in view of the above-described problem, and has, as a problem, providing a film forming apparatus which is of high throughput, and can form a high-density EL layer, and a manufacturing apparatus which has the film forming apparatus in one chamber. Further, it has, as a problem, providing a film forming method which used the film forming apparatus.

(Means for Solving the Problem)

This invention provides such a new film forming method that, on the occasion of evaporating an organic compound material from an evaporation source to form a film, in a film forming chamber, with $5 \times 10^{-3}$ Torr (0.665 Pa) or less, preferably, $1 \times 10^{-1}$ Torr (0.133 Pa) or less, which was set by depressurizing means which was connected to a film forming chamber, gas, which comprises smaller particles than particles of the organic compound material, i.e., a material with a small atomic radius, is flowed in minute amounts, and the material with a small atomic radius is included in an organic compound film. This invention is characterized to improve reliability by intentionally including an inorganic material in the organic compound film.

That is, this invention forms a high-density film by intentionally introducing material gas at the time of film formation, and by including a component of the material gas in the organic compound film, and blocks such a thing that an impurity such as oxygen and moisture which induces deterioration is invaded and diffused in a film.

As the above-described material gas with a small atomic radius, concretely speaking, one kind or plural kinds, which were selected from silane series gas (monosilane, disilane, trisilane etc.), $SiF_4$, $GeH_4$, $GeF_4$, $SnH_4$, or hydro carbon series gas ($CH_4$, $C_2H_2$, $C_2H_4$, $C_6H_6$ etc.), may be used. In passing, also included is mixed gas in which these gasses are diluted by hydrogen, argon and so on. As these gasses, which are introduced into an apparatus, used is one which was highly purified by a gas purification machine before it is introduced into an apparatus. Therefore, there is such a necessity that the gas purification machine has been provided, in order for gas to be introduced after it was highly purified. By this, since it is possible to remove a residual gaseous body (oxygen, moisture and other impurities, and son on) which is included in gas, in advance, it is possible to prevent these impurities from being introduced into an apparatus inside.

For example, in case that there was a fault portion such as a pinhole and a short after Si was included in a film by introducing monosilane gas at the time of deposition and a light emitting device was finalized, the fault portion is heated and thereby, Si is reacted to form an insulative insulator such as SiOx, SiCx, and leakage at a portion of a pinhole and a short is reduced, and an advantage of self-heating, in which a point defect (a dark spot etc.) is not proceeded, is also obtained.

In addition, a component of a material gas, which was introduced by heating a substrate, may be effectively deposited over the substrate.

In addition, it may be radicalized by plasma generating means. For example, in case of monosilane, by plasma generating means, generated is an oxide silicon precursor such as SiHx, SiHxOy, SiOy, and these are deposited on a substrate together with an organic compound material from an evaporation source. Monosilane is easily reacted with oxygen and moisture, and it is possible to reduce an oxygen concentration and a moisture amount in a film forming chamber.

A configuration of this invention, which is disclosed in this specification, is a light emitting apparatus which was equipped with a light emitting device which has an anode over a substrate having an insulation surface, a layer which includes an organic compound which is in contact with the anode, a cathode which is in contact with the layer including the organic compound, and a light emitting apparatus characterized in that, in the above described layer including the organic compound, included is silicon with $1 \times 10^{18}$-$5 \times 10^{20}$ atoms/cm$^3$, preferably $3 \times 10^{18}$-$3 \times 10^{20}$ atoms/cm$^3$ by SIMS measurement.

In case that material gas is reacted with oxygen and moisture, like silane series gas, it is possible to reduce an oxygen concentration and a moisture amount in a film forming chamber to obtain a highly reliable organic compound film. In passing, as a plasma generation method, it is possible to properly use ECR, ICP, helicon, magnetron, 2 frequency, triode or LEP etc.

Also, in this specification, a new film forming apparatus is provided.

A configuration with regard to a film forming apparatus of this invention is a film forming apparatus which deposits an organic compound material from an evaporation source which was placed opposite to a substrate, and carries out film formation over the substrate, and a film forming apparatus characterized in that, in a film forming chamber in which the substrate is placed, a deposition source which accommodates the organic compound material and means for heating the deposition source are provided, and the film forming chamber is coupled to a vacuum pumping processing chamber which vacuates an inside of the film forming chamber, and has means which can introduce material gas.

In addition, by using the film forming apparatus of this invention, it is possible to make a multi-chamber system manufacturing apparatus, and a manufacturing apparatus of this invention is a manufacturing apparatus which has a load chamber, a transfer chamber which was coupled to the load chamber, and a film forming chamber which was coupled to the transfer chamber, and a manufacturing apparatus characterized in that the transfer chamber has a function of carrying out alignment of a mask (deposition mask) and a substrate, and in the film forming chamber in which the substrate is placed, a deposition source which accommodates an organic compound material and means for heating the deposition source are provided, and the film forming chamber is coupled to a vacuum pumping processing chamber which vacuates an inside of the film forming chamber, and has means which can introduce material gas.

In addition, by using the film forming apparatus of this invention, it is also possible to make an inline system manufacturing apparatus in which a load chamber, a transport chamber, and a film forming chamber are coupled in a serial direction, and its configuration is a manufacturing apparatus which has a load chamber, a transfer chamber which was coupled to the load chamber, and a film forming chamber which was coupled to the transfer chamber in a serial direction, and a manufacturing apparatus characterized in that the transfer chamber has a function of carrying out alignment of a mask and a substrate, and in the film forming chamber in which the substrate is placed, a deposition source which accommodates an organic compound material and means for heating the deposition source are provided, and the film forming chamber is coupled to a vacuum pumping processing chamber which vacuates an inside of the film forming chamber, and has means which can introduce material gas.

In addition, in each configuration of the above-described film forming apparatus (and the manufacturing apparatus which was equipped with the film forming apparatus), it is characterized in that the deposition source can be moved in a X direction or a Y direction in the film forming chamber, on an even keel. In addition, on the occasion of deposition, a spacing distance d of a substrate and a deposition source holder is narrowed to representatively 30 cm or less, preferably, 20 cm or less, more preferably 5 cm-15 cm, to dramatically improve utilization efficiency of a deposition material and throughput. The deposition source holder is composed of a container (representatively, a crucible), a heater which was disposed outside the container through a heat even-out member, a heat insulating layer which was disposed outside this heater, an outer tube which accommodates these, a cooling pipe which was wound around an outside of the outer tube, a deposition shutter which opens and closes an opening part of the outer tube including an opening part of the crucible, and a film thickness sensor.

In addition, it is desired that a deposition mask is made to be a metal mask which used a metal material which is hard to be deformed by heat (is of a low thermal expansion coefficient), and can bear with temperature at the time of deposition (e.g., a high melting point metal such as tungsten, tantalum, chrome, nickel or molybdenum, or an alloy which includes these elements, a material such as stainless, inconel, hastelloy. For example, cited are a low thermal expansion alloy of nickel 42%, iron 58% (42 alloy), a thermal expansion coefficient of which is close to a glass substrate ($0.4 \times 10^{-6}$-$8.5 \times 10^{-6}$), a low thermal expansion alloy of nickel 36% (36 invar) and so on.

In addition, in each configuration of the above-described film forming apparatus (and the manufacturing apparatus which was equipped with the film forming apparatus), in the film forming chamber, means for heating the substrate may be provided. In addition, as means for heating the substrate, it is possible to heat by having a stage in which a heater and a heating wire etc. were disposed (may have a function for fixing the substrate), or a metal mask in which a heater and a heating wire etc. were disposed, closely contacted with or come close to the substrate, and it is possible to set temperature of the substrate to 50-200° C., preferably 65-150° C. By heating the substrate, it is possible for a component of the material gas to be easily imported in a organic compound film.

In addition, in each configuration of the above-described film forming apparatus (and the manufacturing apparatus which was equipped with the film forming apparatus), it is characterized in that the above-described means which can introduce the material gas is means for introducing a material gas which was radicalized by plasma generating means. In addition, separately from a system which introduces a material gas, a system which introduces inert gas (nitrogen, argon, etc.) for making an inside of the film forming chamber at normal pressures may be provided. In addition, separately from a system which introduces a material gas, a system which introduces cleaning gas ($H_2$, argon, $NF_3$ etc.) for cleaning an inside of the film forming chamber may be provided.

In addition, a configuration with regard to a cleaning method which is disclosed in this specification is a cleaning method which removes an organic compound which was attached to an inside of a film forming chamber which was equipped with a deposition source, and a cleaning method characterized in that an inner wall, or attachment prevention means which prevents a film from being formed on the inner wall, or a mask is cleaned by generating plasma in an inside of the film forming chamber, or by introducing gas which was ionized by plasma, into the inside of the film forming chamber, and air discharge is carried out by vacuum pumping means.

In the above-described configuration, it is characterized that the plasma is generated by exciting one kind or plural kinds of gasses, which were selected from Ar, H, F, $NF_3$, or O.

In addition, it may be configured in such a manner that, at the time of deposition, plasma is formed by carrying out electric discharge by an antenna system in the film forming chamber, and a component of the ionized material gas is chemically attached to the evaporated organic compound.

In addition, in each configuration of the above-described film forming apparatus, the vacuum pumping means which is disposed so as to be coupled to the film forming chamber vacuates a level of IPa from an atmospheric pressure by an oil-free dry pump, and vacuates a pressure more than that by a magnetic levitation type turbo molecular pump or a complex molecular pump. In the film forming chamber, for the purpose of removing moisture, a cryopump may be disposed in parallel. By doing this, contamination due to an organic matter such as mainly, oil is prevented from pumping means. An inner wall surface is processed as a mirror surface by electrolytic polishing, and a surface area is reduced so that gas discharge is prevented.

In addition, in the above-described each film forming apparatus, by disposing a plurality of deposition sources in one film forming chamber, it is possible to form a plurality of functional regions, and a light emitting device which has a mixed region, in the same film forming chamber. Therefore, in case that an organic compound film, which is composed of a plurality of functional regions, is formed between an anode and a cathode of a light emitting device, it is possible to form a configuration having a mixed region which is composed of both of a material which configures a first functional region, and a material which configures a second functional region, between the first functional region and the second functional region, but not a conventional laminated configuration in which a distinct boundary face exists. By this invention, by having a component of material gas included in a film by introducing the material gas prior to film formation, or during a period of film formation, it is possible to fit more between molecules in the mixed region. By forming the mixed region, an energy barrier between functional regions is mitigated. Therefore, reduction of a drive voltage, and prevention of luminance lowering become possible.

In passing, a first organic compound and a second organic compound have properties which are selected from a group of a hole injection property for accepting a hole from an anode, a hole transport property in which hole mobility is larger than electron mobility, an electron transport property in which electron mobility is larger than hole mobility, an electron injection property for accepting an electron from a cathode, a blocking property in which it is possible to block a move of a hole or an electron, and a light emission property for presenting light emission, and they have the above-described properties which are different from each other, respectively.

In passing, as an organic compound in which the hole injection property is high, a phthalocyanine series compound is preferable, and as an organic compound in which the hole transport performance is high, a aromatic diamine compound is preferable, and in addition, as an organic compound in which the electron transport property is high, a metal complex including a benzoquinoline bone structure, or an oxadiazole derivative, or triazole derivative, or a phenanthroline derivative is preferable. Further, as an organic compound which presents light emission, a metal complex including a quinoline bone structure, a metal complex including a benzoxazole bone structure, or a metal complex including a benzothiazole bone structure which respectively emits light stably is preferable.

Further preferably, it is to configure a luminescent region by a host material, and a luminescent material (dopant) in which excitation energy is lower than the host material, and to design in such a manner that excitation energy of the dopant becomes lower than excitation energy of a hole transport property region and excitation energy of an electron transport layer. By this, it is possible to prevent diffusion of molecular exciters of the dopant, and to have the dopant emit light effectively. In addition, if the dopant is a carrier-trap type material, it is possible to also heighten recombination efficiency of a carrier.

In addition, it is assumed that such a case that a material, in which triplet excitation energy can be converted into light emission, was added to a mixed region as dopant is included in this invention. In addition, in forming the mixed region, concentration gradient may be applied to the mixed region.

In passing, the film forming apparatus in this invention can be used not only for film formation of an organic compound represented by an EL material, but also for film formation of another material such as a metal material which is used for deposition.

In addition, in this specification, a new film forming method is also provided.

A configuration with regard to a film forming method of this invention is a film forming method for depositing an organic compound on a substrate which is placed in a film forming chamber, and a film forming method characterized in that an inside of the film forming chamber is made to be in higher vacuum than $1 \times 10^{-3}$ Torr, and on the occasion of carrying out film formation on the substrate by depositing an organic compound material from a deposition source which was placed opposite to the substrate, material gas is introduced into the film forming chamber at the same time.

In addition, another configuration with regard to the film forming method of this invention is a film forming method for depositing an organic compound on a substrate which was placed in a film forming chamber, and a film forming method characterized in that an inside of the film forming chamber is made to be in higher vacuum than $1 \times 10^{-3}$ Torr, and on the occasion of carrying out film formation on the substrate by depositing an organic compound material from a deposition source which was placed opposite to the substrate, material gas, which was radicalized, is introduced into the film forming chamber at the same time.

In addition, in the above-described each configuration, it is characterized that the material gas is of one kind or plural kinds, which were selected from monosilane, disilane, trisilane, $SiF_4$, $GeH_4$, $GeF_4$, $SnH_4$, $CH_4$, $C_2H_2$, $C_2H_4$, or $C_6H_6$.

In addition, phosphin gas may be introduced in addition to monosilane. In addition, in lieu of monosilane, it is possible to use various gas indicated by $AsH_3$, $B_2H_2$, $BF_4$, $H_2Te$, $Cd(CH_3)_2$, $Zn(CH_3)_2$, $(CH_3)_3In$, $H_2Se$, $BeH_2$, trimethyl gallium, or triethyl gallium.

In addition, as a layer including an organic compound, which is placed between a cathode and an anode, representative is an example in which 3 layers of a hole transport layer, a light emitting layer, an electron transport layer are laminated, but it is not restrictive in particular, and a configuration of laminating in the order of a hole injection layer/a hole transport layer/a light emitting layer/an electron transport layer, or a hole injection layer/a hole transport layer/a light emitting layer/an electron transport layer/an electron injection layer, on the anode, a 2 layers configuration and a single layer configuration may be made. In the light emitting layer, a fluorescence coloring matter etc. may be doped. In addition, as the light emitting layer, there are also a light emitting layer having a hole transport property, a light emitting layer having an electron transport property, and so on. In addition, these layers may be formed by using a low molecular series material, and an 1 layer or several layers among them may be formed by using a high molecular series material. In passing, in this specification, all layers which are disposed between the cathode and the anode are collectively called as a layer including an organic compound (EL layer). Therefore, the above-described hole injection layer, the hole transport layer, the light emitting layer, the electron transport layer and the electron injection layer are all included in the EL layer. In addition, the layer including the organic compound (EL layer) may include an inorganic material such as silicon.

In passing, a light emitting device (EL device) has a layer including an organic compound in which obtained is electro luminescence which is generated by applying an electric field (hereinafter, inscribed as an EL layer), an anode, and a cathode. As luminescence in an organic compound, there are light emission (fluorescence) on the occasion of returning from a singlet excitation state to a ground state, and light emission (phosphorescent) on the occasion of returning from a triplet excitation state to the ground state, and a case in which either light emission was used is applicable to a light emitting apparatus which is fabricated by this invention.

In passing, in this specification, all layers, which are disposed between an a cathode and an anode are collectively called as an EL layer. Therefore, the above-described hole injection layer, the hole transport layer, the light emitting layer, the electron transport layer and the electron injection layer are all included in the EL layer.

In addition, in the light emitting apparatus of this invention, a drive method of screen display is not restrictive in particular, and for example, a point sequential driving method, a line sequential driving method, a surface sequential driving method, and so on may be used. Representatively, the line sequential driving method is used, and a time division tone driving method and an area tone driving method may be used properly. In addition, a video signal, which is inputted into a source line of a light emitting apparatus may be an analog signal, or may be a digital signal, and a drive circuit and so on may be designed properly, in accordance with the video signal.

In addition, in this specification, a light emitting device, which is formed by a cathode, an EL layer and an anode, is called as an EL device, and as to this, there are 2 types of systems in which the EL layer is formed between 2 types of stripe shaped electrodes (simple matrix system), or a system in which the EL layer is formed between pixel electrodes which were connected to TFT s and arranged in a matrix shape, and an opposed electrode (active matrix system).

BEST MODE FOR CARRYING OUT THE INVENTION

Embodiment modes of this invention will be hereinafter described.

Embodiment Mode 1

Figure 1:
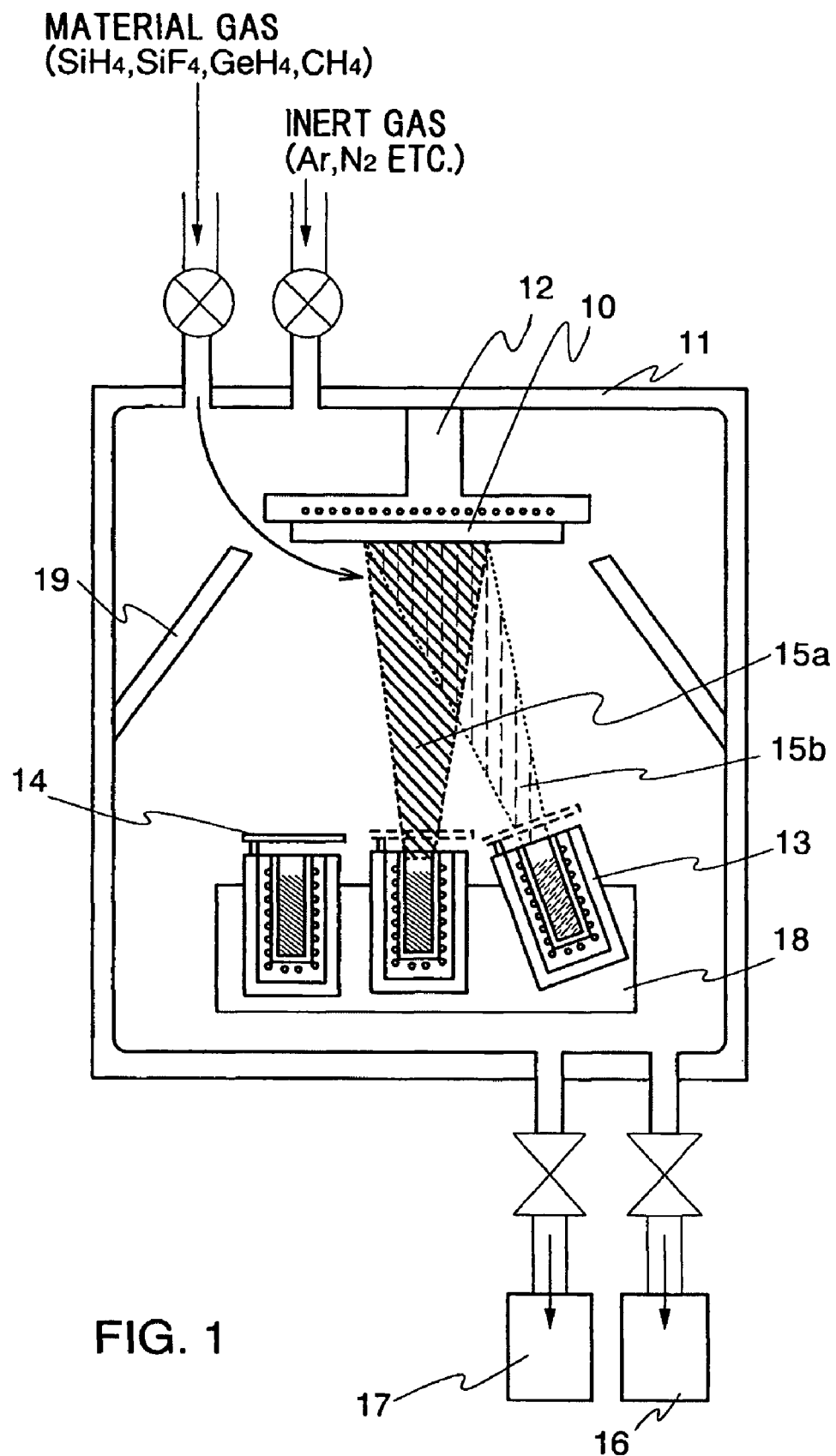
FIG. 1 is a cross-sectional view of a film forming apparatus of this invention showing an embodiment mode 1.

A configuration of a film forming apparatus in this invention will be described by use of FIG. 1. FIG. 1 is one example of a cross-sectional view in the film forming apparatus of this invention.

On the occasion of carrying out film formation by a deposition method, it is preferable to use a face-down system (also called as a depo-up system), and a substrate 10 is set with a film formed surface downward. A system, in which film formation is carried out with a film formed surface of a substrate face downward, is called as the face-down system, and according to this system, it is possible to suppress attachment of dust.

As shown in FIG. 1, in contact with the substrate 10, heating means, here, a heater is disposed on a substrate holder 12. By heating means, it is possible to set temperature of the substrate to 50-200° C., preferably, 65-150° C. In addition, the substrate 10 is fixed by being sandwiched by metal masks (not shown in the figure), by a permanent magnet which was built in the substrate holder. In addition, on a level block 18 which was disposed in a film forming chamber, deposition cells (also called as deposition holders) 13, which are also capable of being heated to temperatures which are different from each other, are disposed. In passing, a deposition source is disposed so as to be opposed to the substrate. Here, shown was an example in which the substrate was fixed by being sandwiched by metal masks, by use of the permanent magnet, but it may be fixed by a holder.

Here, the deposition source is composed of the deposition cells 13, a container which accommodates an organic compound (a crucible, a deposition board, etc.), a shutter 14, heating means for heating the organic compound, and a heat insulating material for surrounding a periphery. As the heating means, a resistance heating type is standardized, but a Knudsen cell may also be used.

In addition, to the film forming chamber, coupled are a gas introduction system which introduces material gas by several sccm into the film forming chamber at the time of deposition, and a gas introduction system which makes an inside of the film forming chamber at normal pressures. As the material gas, used are one kind or plural kinds, which were selected from monosilane, disilane, trisilane, $SiF_4$, $GeH_4$, $GeF_4$, $SnH_4$, $CH_4$, $C_2H_2$, $C_2H_4$, or $C_6H_6$. In passing, it is desirable to make no material gas flow from a gas introduction port to a gas discharge port by the most direct way.

When a space surrounded by a chamber wall 11 is depressurized to $5 \times 10^{-3}$ Torr (0.665 Pa) or less, preferably, $1 \times 10^{-3}$ Torr (0.133 Pa) or less, by depressurizing means (a turbo molecular pump 16 or a vacuum pump such as a dry pump and a cryopump 17), and the organic compound in an inside is heated up to sublimation temperature by heating means which was disposed in the deposition cell (resistance which is generated on the occasion that a voltage was applied (resistance heating)). It is evaporated and deposited on a surface of the substrate 10. By introducing a material gas with several sccm on the occasion of this deposition, a component of the material gas is included in a film. In passing, in FIG. 1, shown is such an example that co-deposition is carried out with one cell being inclined, so that an evaporated first material 15a and an evaporated second material 15b are mixed, and further, introduced material is mixed to form a film. The co-deposition is referred to a deposition method in which different deposition sources are heated and evaporated at the same time, and different materials are mixed in a film forming stage. In addition, the substrate holder 12 is rotated so as to equalize a film thickness, on the occasion of deposition.

In passing, it is assumed in this specification that the surface of the substrate includes the substrate, and a thin film which was formed on the same, and here, it is assumed that an anode or a cathode is formed on the substrate.

In passing, the shutter 14 controls deposition of an evaporated organic compound. In short, when the shutter is opened, it is possible to deposit an organic compound which was evaporated by heating. Further, one or a plurality of other shutters (e.g., a shutter which covers a deposition source during a period until sublimation from the deposition source is stabilized) may be disposed between the substrate 10 and the shutter 14.

In passing, it is desirable to heat and evaporate an organic compound prior to deposition, and to be able to immediately start deposition once the shutter 14 is opened at the time of deposition, since film forming time is shortened.

In addition, in the film forming apparatus in this invention, it becomes possible to form an organic compound film having a plurality of functional regions in one film forming chamber, and a plurality of deposition sources are disposed in accordance with it.

In addition, disposed is an anti-attachment plate 19 for preventing an organic compound from being attached to an inner wall at the time of deposition. By disposing this anti-attachment plate 19, it is possible to have an organic compound, which is not deposited on a substrate, attached.

In addition, the film forming chamber is coupled to a plurality of vacuum pumping processing chambers which evacuate an inside of the film forming chamber. As the vacuum pumping processing chamber, it is equipped with a magnetic levitation type turbo molecular pump 16 and a cryopump 17. By this, it is possible to set ultimate vacuum of the film forming chamber to $10^{-5}$-$10^{-6}$ Torr. In passing, it is designed to stop the cryopump 17 after vacuum pumping was carried out by the cryopump 17, and to carry out deposition over flowing material gas with several sccm, while carrying out vacuum pumping by the turbo molecular pump 16. After deposition was finished, inert gas is introduced while discharging air by the turbo molecular pump, to increase a pressure to some extent, and remaining material gas is discharged from the film forming chamber, and high vacuum pumping is carried out again. Finally, a deposited substrate is taken out from the film forming chamber to a load chamber while keeping vacuum.

In addition, as a material which is used for a chamber wall 11, since it is possible to lessen sorbability of an impurity such as oxygen and water, by lessening its surface area, aluminum and stainless (SUS) etc., which were changed to a mirror surface by applying electrolytic polishing, are used for an inside wall surface. By this, it is possible to maintain a degree of vacuum in an inside of the film forming chamber to $10^{-5}$-$10^{-6}$ Torr. Also, a material such as ceramics, which was processed so as for air holes to get fewer in the extreme, is used for an inside member. In passing, it is preferable that these are materials having such surface smoothness that center line average asperity becomes 3 nm or less.

If the film forming apparatus shown in FIG. 1 is used, it is possible to form a high-density film by intentionally introducing material gas at the time of film forming, and by having a component of the material gas included in an organic compound film. By having a component of a material gas included in an organic compound film, it is possible to block an impurity such as oxygen and moisture which causes deterioration from being intruded, diffused in a film, and to improve reliability of a light emitting device.

For example, when monosilane gas with several sccm is introduced into a film forming chamber in which deposition is going on by evaporating an organic material, together with the organic material which is evaporated from a deposition source and proceeding to a substrate, $SiH_4$, which is floating in the film forming chamber is taken in an organic film. That is, a gap of organic material molecules with a relatively large particle radius is to be filled in with $SiH_4$ with a small atomic radius as it is, or with SiHx, and it is possible to have it included in an organic film. During a period of deposition, a deposition source is heated to a level of 100° C., but decomposition temperature (decomposition temperature under atmospheric pressure) of monosilane is approximately 550° C., and therefore, it is not decomposed. According to an organic material to be evaporated, there is also such a case that it is reacted with $SiH_4$, or SiHx to form a compound. In addition, since oxygen (or moisture), which slightly remains in the film forming chamber, is captured to generate SiOx, it is possible to reduce oxygen (or moisture) which is a factor for deteriorating an organic material in the film forming chamber and in a film, and accordingly, it is possible to improve reliability of a light emitting device. In addition, generated SiOx may be included in a film as it is.

It is conceivable that, when there is a gap of organic material molecules in a film, it is easy for oxygen to enter into the gap, and deterioration is generated. Therefore, since it is only sufficient to fill in this gap, it is possible to improve reliability of a light emitting device, even by using $SiF_4$, $GeH_4$, $GeF_4$, $SnH_4$, or hydro carbon series gas ($CH_4$, $C_2H_2$, $C_2H_4$, $C_6H_6$ etc.).

In passing, as the above-described organic material, it is possible to point to α-NPD(4,4'-bis-[N-(naphthyl)-N-phenyl-amino]biphenyl), BCP(basocuproine), MTDATA(4,4', 4"-tris(N-3-metylphenyl-N-phenyl-amino)triphenyl amine), $Alq_3$(tris-8-quinolinoaluminum complex) and so on.

Hereinafter, by use of the film forming apparatus of FIG. 1, shown is one example of a fabricating procedure of a light emitting device having an anode, an organic compound layer which is in contact with the anode, and a cathode which is in contact with the organic compound layer.

Firstly, a substrate, on which an anode was formed, is carried in a carry-in chamber (not shown in the figure). As a material which forms the anode, a transparent conductive material is used, and it is possible to use an indium/tin compound, zinc oxide and so on. Then, it is transferred to a film formation pretreatment chamber (not shown in the figure) which was coupled to the carry-in chamber (not shown in the figure). In this film formation pretreatment chamber, cleaning of an anode surface, oxidation treatment, heat treatment etc. may be carried out. As the cleaning of the anode surface, irradiation of ultraviolet rays is carried out in vacuum, and the anode surface is cleaned. In addition, as the oxidation treatment, it may be irradiated with ultraviolet rays in an atmosphere including oxygen, while being heated with 100-120° C., and it is useful to such a case that the anode is an oxide like ITO. In addition, as the heat treatment, heating with heat temperature of 50° C. or more, at which a substrate is sustainable in vacuum, preferably, heating of 65-150° C. may be carried out, and removed is an impurity such as oxygen and moisture attached to the substrate, and an impurity such as oxygen and moisture in a film formed on the substrate. In particular, since an EL material easily gets deteriorated by an impurity such as oxygen and water, it is useful to heat in vacuum prior to deposition.

Then, the substrate, for which the above-described pretreatment was finished, is carried in the film forming chamber without contact with atmospheric air. In the film forming chamber, the substrate 10 is set with a film formed surface downward. In passing, it is preferable that vacuum pumping is applied to an inside of the film forming chamber before the substrate is carried in.

Vacuum pumping means, which is disposed so as to be coupled to the film forming chamber, vacuates a level of 1 Pa from an atmospheric pressure by an oil-free dry pump, and vacuates a pressure more than that by the magnetic levitation type turbo molecular pump 16. Further, in the film forming chamber, for the purpose of removing moisture, the cryopump 17 is disposed in parallel. By doing this, a degree of vacuum up to $1 \times 10^{-6}$ Torr is realized.

On the occasion of carrying out vacuum pumping an inside of the film forming chamber, it is possible to remove absorbed water and absorbed oxygen which were attached to a film forming chamber inner wall, a metal mask and an anti-attachment shield at the same time. Further, it is preferable that the film forming chamber is heated before the substrate is carried in. After the substrate, which was heated in the pretreatment, was cooled slowly, and carried in the film forming chamber, it is heated again, which takes long time and invites lowering of throughput. Preferably, the substrate, which was heated by heat treatment which was carried out in the pretreatment, is carried in and set in the heated film forming chamber as it is, without being cooled. In passing, since heating means for heating the substrate is disposed in the substrate holder 12 in the apparatus shown in FIG. 1, it is possible to also carry out heat treatment in vacuum, which is the pretreatment, in the film forming chamber.

Here, heat treatment in vacuum (anneal) is carried out in the film forming chamber before deposition is carried out. By this anneal (deairing), removed are an impurity such as oxygen and moisture attached to the substrate, and an impurity such as oxygen and moisture in a film formed on the substrate. Since the impurity, which was removed in this manner, is removed from the film forming chamber, it is preferable to carry out vacuum pumping, and further, a degree of vacuum may be heightened.

Then, deposition is carried out in the film forming chamber which was vacuated up to a degree of vacuum of $5 \times 10^{-3}$ Torr (0.665 Pa) or less, preferably $10^{-4}$-$10^{-6}$ Torr, over introducing material gas with several sccm. On the occasion of deposition, a first organic compound has been evaporated by resistance heating in advance, and flies in a direction of the substrate 10 by the shutter 14 being opened at the time of deposition. The evaporated organic compound flies upward, and mixed with material gas, and deposited on the substrate 10, passing through an opening part (not shown in the figure) which was disposed in a metal mask. In passing, on the occasion of deposition, temperature of the substrate is set to 50-200° C., preferably 65-150° C., by means for heating the substrate.

In the apparatus shown in FIG. 1, heating means for heating the substrate is disposed, and heat treatment in vacuum is carried out during a period of film forming. Since there is such fear that an impurity such as oxygen and moisture is mixed in an evaporation material at the time of deposition, it is useful to carry out heat treatment in vacuum during a period of deposition and to have gas included in a film discharged. In this manner, by carrying out deposition over heating the substrate in vacuum, and by carrying out film formation up to a desired film thickness, it is possible to form a high-density organic compound layer. In passing, an organic compound, which is mentioned here, is an organic compound which has a property such as a hole injection property for accepting a hole from an anode, a hole transport property in which hole mobility is larger than electron mobility, an electron transport property in which electron mobility is larger than hole mobility, an electron injection property for accepting an electron from a cathode, a blocking property in which it is possible to block a move of a hole or an electron, and a light emission property for presenting light emission.

In this manner, deposition of an organic compound is finished, and a film, which is composed of the organic compound, is formed on an anode.

Further, in order to reduce an impurity such as moisture and oxygen in the obtained organic compound layer, heat treatment is carried out with a pressure of $1 \times 10^{-4}$ Torr or less, and heat treatment for having moisture etc. mixed in at the time of deposition, discharged may be carried out. Since there is such fear that an impurity such as oxygen and moisture is mixed in an evaporation material at the time of deposition, it is useful to carry out heat treatment in vacuum after deposition, and to have gas included in a film, discharged. In case of carrying out anneal after deposition, it is preferable to carry the substrate in a processing chamber which is different from the film forming chamber, without contact with atmospheric air, and to carry out anneal in vacuum.

Since heating means for heating the substrate is disposed in the apparatus shown in FIG. 1, it is possible to also carry out heat treatment in vacuum in the film forming chamber after film formation. It is preferable to carry out anneal of 100-200° C., after deposition, with further higher vacuum than a degree of vacuum on the occasion of deposition. By this anneal (deairing) after film formation, an impurity such as oxygen and moisture in an organic compound layer formed on the substrate is further removed, and a high-density organic compound layer is formed.

In the organic compound layer, material gas or a main component of material gas, for example, in case that monosilane gas was introduced on the occasion of deposition, silicon of 0.01 atoms %-5 atoms % by SIMS measurement, preferably an extent of 1 atoms %-2 atoms % is designed to be included. Since a film, which includes an organic compound formed as a film by use of the film forming apparatus shown in FIG. 1, becomes a film which includes material gas or a main component of material gas, and in which it is hard to get in oxygen and moisture, improved is reliability of a light emitting device which used this film including an organic compound.

The processes, which were indicated up to here, are of a case of forming a single layer of an organic compound.

Hereinafter, by repeating the above-described forming processes of a single layer, a desired organic compound layer is laminated, and finally, a cathode is formed as a laminated layer. In passing, in case of laminating different evaporation materials (an organic compound and a material of a cathode), they may be carried out in separate film forming chambers, and all are laminated as a film in the same film forming chamber. As a material of a cathode, a material including magnesium (Mg), lithium (Li) or calcium (Ca), in which a work function is small, is used. Preferably, an electrode, which comprises MgAg (a material in which Mg and Ag were mixed with Mg:Ag=10:1) may be used. Besides, cited are ytterbium (Yb), MgAgAl electrodes, LiAl electrodes, or LiFAl electrodes. In this manner, it is possible to fabricate a light emitting device which has an anode, an organic compound layer which is in contact with the anode, and a cathode which is in contact with the organic compound layer. In addition, it is possible to carry out anneal before film formation, in a film forming chamber, and in that case, throughput is improved. In addition, it is possible to carry out anneal after film formation, and in that case, throughput is improved.

Embodiment Mode 2

Figure 2:
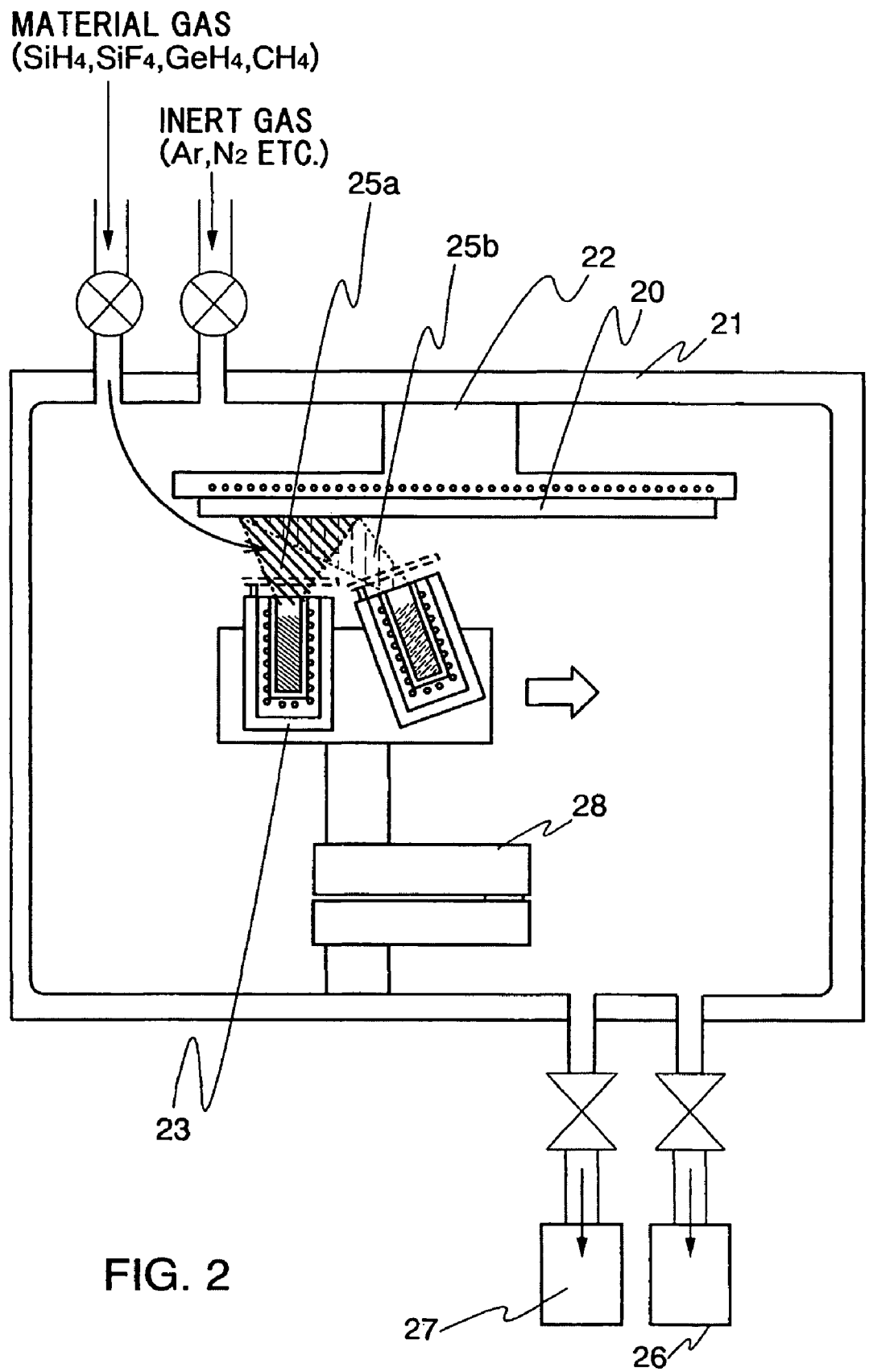
FIG. 2 is a cross-sectional view of a film forming apparatus of this invention showing an embodiment mode 2.

Here, a film forming apparatus, which is different from the embodiment mode 1, is shown in FIG. 2.

FIG. 2 shows an example of a film forming apparatus in which a deposition source is moved (or rotated), so as for a film to be formed uniformly.

In FIG. 2, 20 designates a substrate, and 21 designates a chamber wall, and 22 designates a substrate holder, and 23 designates a cell, and 25a designates an evaporated first material, and 25b designates an evaporated second material, and 26 designates a turbo molecular pump, and 27 designates a cryopump, and 28 designates a moving mechanism for moving the cell. Since there is no necessity to rotate the substrate, it is possible to provide a deposition apparatus which can correspond to a large area substrate. In addition, by the deposition cell 23 moving in a X axis direction and a Y axis direction to the substrate, it becomes possible to form a deposition film uniformly.

In the deposition apparatus of this invention, on the occasion of deposition, a spacing distance d of the substrate 20 and the deposition cell 23 is narrowed to representatively 30 cm or less, preferably, 20 cm or less, more preferably 5 cm-15 cm, to dramatically improve utilization efficiency of a deposition material and throughput.

In addition, there is not such a necessity that an organic compound, which is provided on the deposition cell 23, is one or of one type, and a plural number is fine. For example, other than a material of one type, which is provided in the deposition source holder as a luminescent organic compound, another organic material (dopant material), which can become dopant, may be provided all together. As an organic compound layer to be evaporated, it is configured by a host material, and a luminescent material (dopant material) whose excitation energy is lower than the host material, and it is designed in such a manner that excitation energy of dopant becomes lower than excitation energy of a hole transport property region, and excitation energy of an electron transport layer, which is preferable. By this, it is possible to prevent diffusion of molecular exciters of the dopant, and to have the dopant emit light effectively. In addition, if the dopant is a carrier-trap type material, it is possible to also heighten recombination efficiency of a carrier. In addition, such a case that a material, which can convert triplet excitation energy into light emission, was added to a mixed region as dopant is assumed to be included in this invention. In addition, in forming the mixed region, concentration gradient may be applied to the mixed region.

Further, in case of using a plurality of organic compounds which are provided in one deposition source holder, it is desirable to tilt an evaporating direction so as to be crossed at a position of a material to be deposited, so that the organic compounds are mixed with each other. In addition, for the purpose of carrying out co-deposition, in the deposition cell, 4 kinds of deposition materials (e.g., as a deposition material a, 2 kinds of host materials, and as a deposition material b, 2 kinds of dopant materials) may be provided.

In addition, in case of citing a major process in which there is such fear that an impurity such as oxygen and water is mixed in, to an EL material and a metal material to be evaporated, a process for setting an EL material in a film forming chamber prior to deposition, a deposition process, and so on are conceivable.

In this connection, it is preferable to provide a glove in a pretreatment chamber which was coupled to a film forming chamber, and to move a deposition source in its entirety from the film forming chamber to the pretreatment chamber, and to set a deposition material in the deposition source in the pretreatment chamber. That is, designed is a manufacturing apparatus in which a deposition source is moved up to a pretreatment chamber. By doing this, it is possible to set a deposition source, while maintaining a cleaning level of the film forming chamber.

Also in the film forming apparatus shown in FIG. 2, by intentionally introducing material gas at the time of film formation, and by including a component of the material gas in an organic compound film, it is possible to make a high-density film. By including a component of the material gas in the organic compound film, it is possible to block an impurity such as oxygen and moisture which causes deterioration from being intruded, diffused in a film, and to improve reliability of a light emitting device.

In addition, it is possible to freely combine this embodiment mode with the embodiment mode 1.

Embodiment Mode 3

Figure 3:
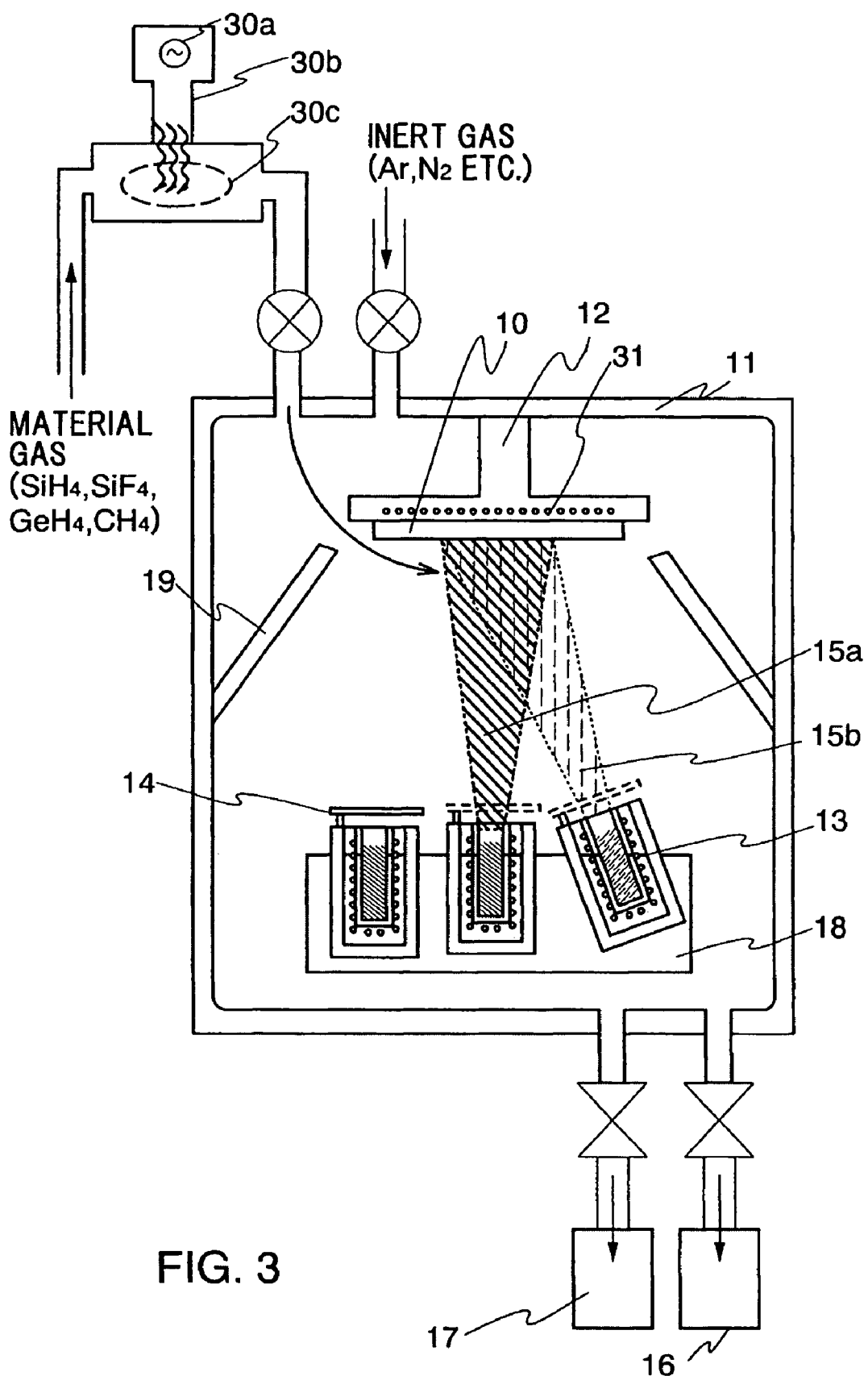
FIG. 3 is a cross-sectional view of a film forming apparatus of this invention showing an embodiment mode 3.

Here, a film forming apparatus, which is different from the embodiment mode 1, is shown in FIG. 3. In passing, the same reference numerals are used for the same places as in FIG. 1.

The film forming apparatus shown in FIG. 3 is an example in which deposition is carried out over introducing material gas, which was radicalized by plasma generating means in advance, into a film forming chamber.

As shown in FIG. 3, a microwave source 30*a* is connected to a waveguide 30*b*. This waveguide 30*b* forms plasma 30*c* due to glow discharge, by carrying out irradiation to material gas in a discharge tube. From the microwave source which is used here, μ wave of approximately 2.45 GHz is radiated.

For example, in case that monosilane gas was used as material gas, an oxide silicon precursor such as SiHx, SiHxOy, SiOy is generated, and introduced into a film forming chamber. These radicals are easily reacted with oxygen and moisture, and it is possible to reduce oxygen concentration and a moisture amount in the film forming chamber, and accordingly, it is possible to obtain an organic compound film with high reliability.

In addition, since these radicals are easily moved to, or deposited at a place with higher temperature, it is desirable to carry out deposition over heating a substrate by a heater 31 which is disposed in the substrate holder 12. In addition, for the purpose of preventing it from being moved to, or deposited on the deposition cell 13, it is desirable to cover the deposition cell 13 by a heat insulating material.

In addition, it is possible to freely combine this embodiment mode with the embodiment mode 1 or the embodiment mode 2.

Embodiment Mode 4

Figure 4:
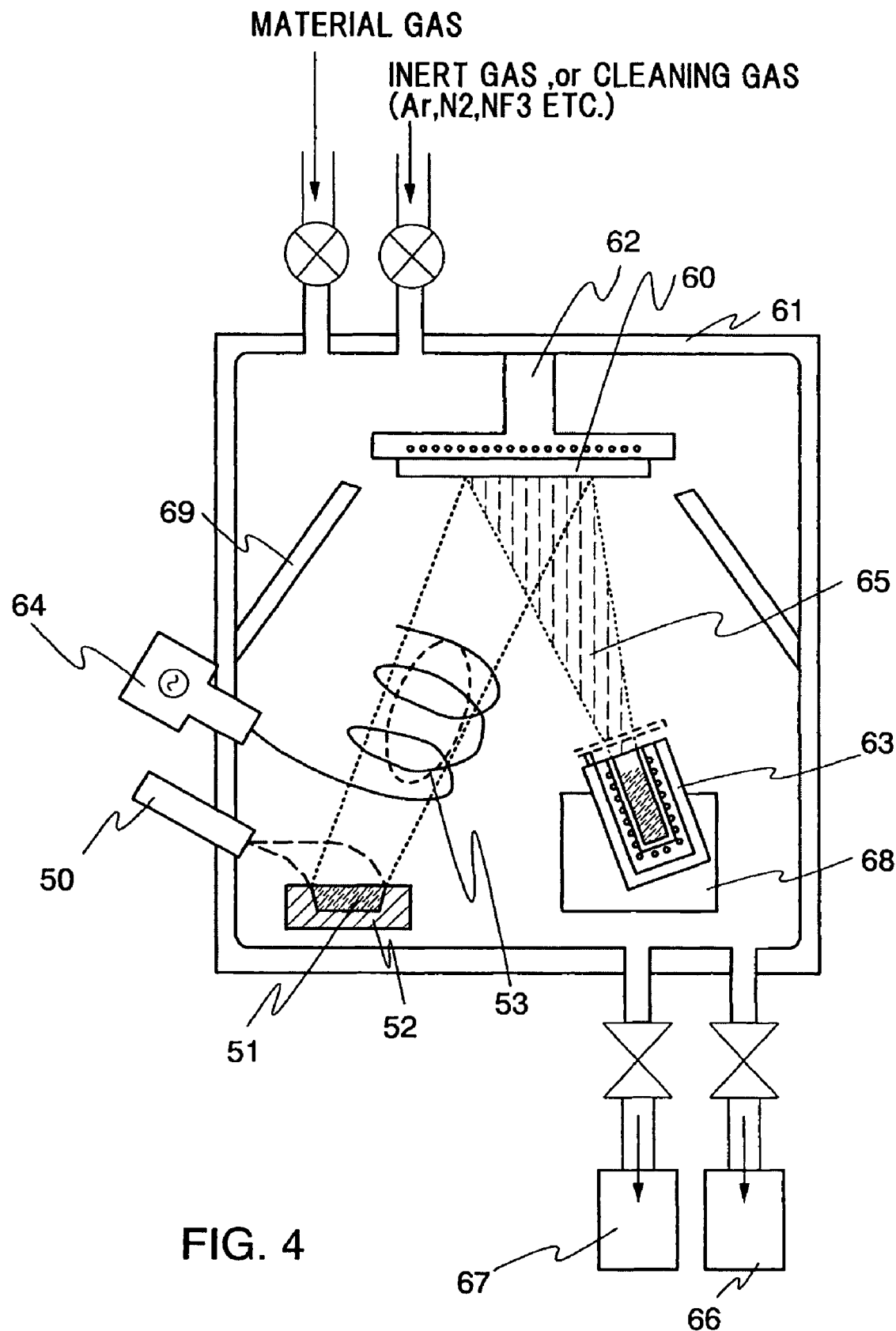
FIG. 4 is a cross-sectional view of a film forming apparatus of this invention showing an embodiment mode 4.

Here, a film forming apparatus, which is different from the embodiment mode 1, is shown in FIG. 4.

The film forming apparatus shown in FIG. 4 is an example in which, by using an ion plating method, material gas is ionized in a film forming chamber, and attached to an evaporated organic material 65, and along with it, deposition is carried out.

In FIG. 4, 60 designates a substrate, and 61 designates a chamber wall, and 62 designates a substrate holder, and 63 designates a cell, and 65 designates an evaporated organic material, and 66 designates a turbo molecular pump, and 67 designates a cryopump, and 68 designates a level block, and 69 designates an anti-attachment plate.

In the film forming apparatus shown in FIG. 4, disposed are an electron gun 50 for irradiating an electron beam to a crucible 52 which accommodated a material 51, and plasma generating means 64 for generating plasma 53.

An electron beam is irradiated to the crucible 52 by the electron gun 50, to melt, and evaporate the material 51 in the crucible, and an evaporation flow of the material 51 is formed, and ionized by the plasma generating means 64, and the ionized evaporation flow and the organic material 65 evaporated from the deposition cell 63 are mixed, and by bombarding these against the substrate, a film is formed.

In the film forming apparatus shown in FIG. 4, the material 51, which was evaporated in midstream of deposition of an organic material, is chemically attached, and, a component of the material 51 is included in an organic compound film, and thereby, it is possible to make a high-density film. By having a component of a material 51 included in an organic compound film, it is possible to block an impurity such as oxygen and moisture which causes deterioration from being intruded, diffused in a film, and to improve reliability of a light emitting device.

In addition, it is possible to freely combine this embodiment mode with any one of the embodiment modes 1 through 3.

As to this invention comprising the above-described configuration, it will be described in detail with embodiments shown as follows.

EMBODIMENTS

Embodiment 1

In this embodiment, shown is an example of fabricating various light emitting devices which have yet functions of a plurality of materials, in the same manner as a function separation of a laminated configuration, at the same time of heightening mobility of carriers by mitigating an energy barrier which exists in an organic compound film.

With regard to mitigation of the energy barrier in the laminated configuration, it is notably seen in a technology of insertion of a carrier injection layer. In short, in a boundary face of a laminated configuration with a large energy barrier, by inserting a material for mitigating that energy barrier, it is possible to design the energy barrier stepwise. By this, it is possible to heighten a carrier injection property from an electrode, and indeed, to lower a drive voltage to some extent. However, a problem is that, by increasing the number of layers, the number of organic boundary faces is increased conversely. This is considered to be a cause of such a fact that a single layer configuration is holding top data of drive voltage/power efficiency. Conversely speaking, by overcoming this point, over exploiting a merit of the laminated configuration (it is possible to combine various materials, and there is no necessity of a complex molecular design), it is possible to yet catch up the drive voltage/power efficiency of the single layer configuration.

In this connection, in case that an organic compound film, which is composed of a plurality of functional regions, is formed between an anode and a cathode of a light emitting device, it is possible to form a configuration having a mixed region which is composed of both of a material which configures a first functional region, and a material which configures a second functional region, between the first functional region and the second functional region, but not a conventional laminated configuration in which a distinct boundary face exists.

By applying the above configuration, it is conceivable that an energy barrier, which exists between functional regions, is reduced as compared to a conventional configuration, and an injection property of carriers is improved. That is, the energy barrier between functional regions is mitigated by forming the mixed region. Therefore, it becomes possible to prevent reduction of a drive voltage, and luminance lowering.

From the foregoing, in this embodiment, in a light emitting device which has at least a region (first functional region) in which a first organic compound can express a function, and a region (second functional region) in which a second organic compound, which is different from a substance configuring the first functional region, can express a function, and in fabrication of a light emitting apparatus which has this, by using the film forming apparatus shown in FIG. 1, between the first functional region and the second functional region, fabricated is a mixed region which is composed of an organic compound which configures the first functional region, and an organic compound which configures the second functional region.

In the film forming apparatus shown in FIG. 1, it is designed that an organic compound film, which has a plurality of functional regions, is formed in one film forming chamber, and a plurality of deposition sources are also disposed in accordance with it. In passing, a substrate, on which an anode is formed, is carried in and set.

Firstly, a first organic compound, which is provided in a first material chamber, is deposited. In passing, the first organic compound has been evaporated in advance by resistance heating, and flies in a direction of a substrate by a first shutter being opened at the time of deposition. On the occasion of deposition, material gas, here, monosilane gas is introduced, and included in a film. By this, it is possible to form a first functional region 210 shown in FIG. 5(A).

And, over depositing the first organic compound 17a, a second shutter is opened, and a second organic compound, which is provided in a second material chamber, is deposited. In passing, the second organic compound has also been evaporated in advance by resistance heating, and flies in a direction of the substrate by the second shutter being opened at the time of deposition. On the occasion of deposition, material gas, here, monosilane gas is introduced, and included in a film. By this, it is possible to form a first mixed region 211, which is composed of the first organic compound and the second organic compound.

And, after a brief interval, only the first shutter is closed, and the second organic compound is deposited. On the occasion of deposition, material gas, here, monosilane gas is introduced, and included in a film. By this, it is possible to form a second functional region 212.

In passing, in this embodiment, shown was a method of forming a mixed region by depositing 2 kinds of organic compounds at the same time, but it is also possible to form a mixed region between a first functional region and a second functional region, after a first organic compound was deposited, by depositing a second organic compound under its deposition atmosphere.

Next, over depositing the second organic compound, a third shutter is opened, and a third organic compound, which is provided in a third material chamber, is deposited. In passing, the third organic compound has also been evaporated in advance by resistance heating, and flies in a direction of the substrate by the third shutter being opened at the time of deposition. On the occasion of deposition, material gas, here, monosilane gas is introduced, and included in a film. By this, it is possible to form a second mixed region 213, which is composed of the second organic compound and the third organic compound.

And, after a brief interval, only the second shutter is closed, and the third organic compound is deposited. On the occasion of deposition, material gas, here, monosilane gas is introduced, and included in a film. And, by closing the third shutter, deposition of the third organic compound is completed. By this, it is possible to form a third functional region 214.

Finally, by forming a cathode, a light emitting device, which is formed by the film forming apparatus of this invention, is completed.

Figure 5:
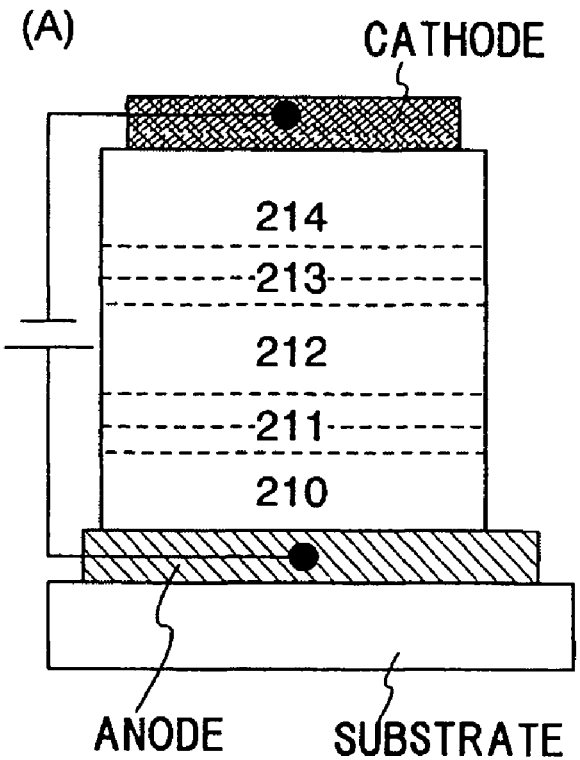
FIGS. 5A and 5B are views for explaining a device configuration which is fabricated by the film forming apparatus of this invention showing an embodiment 1.
Figure 5:
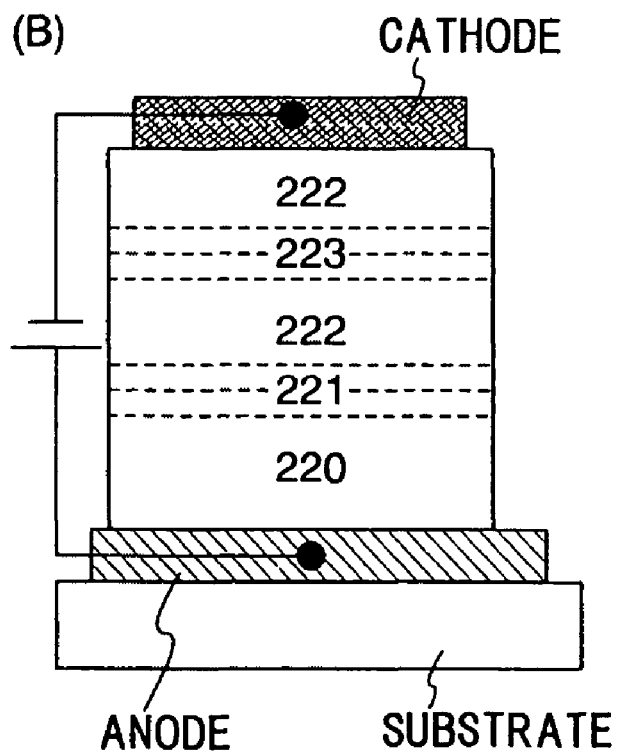

Further, as another organic compound film, as shown in FIG. 5(B), after a first functional region 220 was formed by using a first organic compound, a first mixed region 221, which is composed of the first organic compound and a second organic compound, is formed, and further, by using the second organic compound, a second functional region 222 is formed. And, in midstream of forming the second functional region 222, a third shutter is opened temporarily, and deposition of a third organic compound 17c is carried out simultaneously, and thereby, a second mixed region 223 is formed.

After a brief interval, by closing the third shutter, the second functional region 222 is formed again. And, by forming a cathode, a light emitting device is formed.

Since the film forming apparatus of FIG. 2, which can form an organic compound film as described above, can form an organic compound film having a plurality of functional regions, in the same film forming chamber, it is possible to form a mixed region on a functional region boundary face. By the foregoing, it is possible to fabricate a light emitting device which does not show a clear laminated configuration (i.e., there is no distinct organic boundary face), and had a plurality of functions.

In addition, the film forming apparatus of FIG. I is capable of introducing material gas (monosilane gas) intentionally at the time of the film formation, and having a component of the material gas included in an organic compound film, and by having a material with a small atomic radius (representatively, silicon) included in an organic compound film, it is possible to fit more between molecules in the mixed region. Therefore, further, it becomes possible to prevent reduction of a drive voltage, and luminance lowering. In addition, it is further possible to remove an impurity such as oxygen and moisture in a film forming chamber by the material gas, and it is possible to form a high-density organic compound layer.

In addition, it is possible to freely combine this embodiment with the embodiment mode 1, the embodiment mode 2, the embodiment mode 3, or the embodiment mode 4.

Embodiment 2

Figure 6:
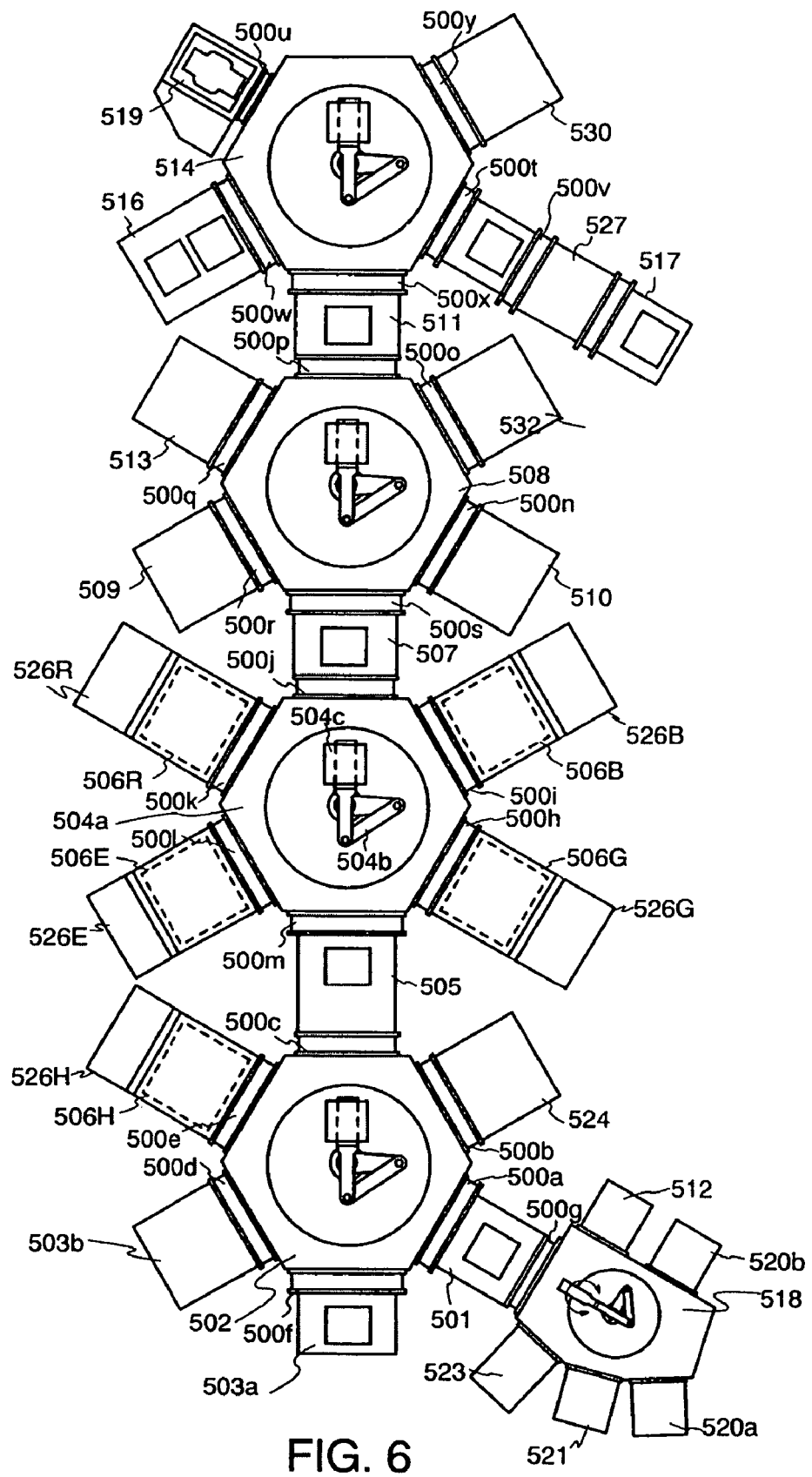
FIG. 6 is a view showing a multi-chamber system manufacturing apparatus showing an embodiment 2.

In this embodiment, an example of a multi-chamber type manufacturing apparatus, in which fabrication from a first electrode up to sealing was fully automated, is shown in FIG. 6.

FIG. 6 shows a multi-chamber manufacturing apparatus which has gates 500a-500y, transfer chambers 502, 504a, 508, 514, 518, hand-over chambers 505, 507, 511, a loading chamber 501, a first film forming chamber 506H, a second film forming chamber 506B, a third film forming chamber 506G, a fourth film forming chamber 506R, a fifth film forming chamber 506E, and other film forming chambers 509, 510, 512, 513, 531, 532, installation chambers 526R, 526G, 526B, 526E, 526H in which deposition sources are installed, pretreatment chambers 503a, 503b, a sealing chamber 516, a mask stock chamber 524, a seal substrate stock chamber 530, cassette chambers 520a, 520b, a tray mounting stage 521, and a pull-out chamber 519. In passing, in the transport chamber 504a, disposed is a transport mechanism 504b for transporting a substrate 504c, and in other transport chambers, transport mechanism are also provided, respectively, in the same manner.

Hereinafter, a procedure for carrying a substrate, on which an anode (first electrode), and an insulator (partition wall) which covers an end part of the anode were disposed, in a manufacturing apparatus shown in FIG. 6, and for fabricating a light emitting apparatus will be shown. In passing, in case of fabricating an active matrix type light emitting apparatus, a plurality of thin film transistors (current control TFTs) which are connected to an anode, and other thin film transistors (switching TFTs, etc.) have been disposed on a substrate in advance, and a drive circuit, which is composed of thin film transistors, is also disposed. In addition, also in case of fabricating a simple matrix type light emitting apparatus, it is possible to fabricate by the manufacturing apparatus shown in FIG. 6.

Firstly, the above-described substrate is set to the cassette chamber 520a or the cassette chamber 520b. In case that the substrate is a large size substrate (e.g., 300 mm×360 mm), it is set to the cassette chamber 520b, and in case that it is a normal substrate (e.g., 127 mm×127 mm), after it was set to the cassette chamber 520a, it is transferred to the tray mounting stage 521, and a plurality of substrates are set to a tray (e.g., 300 mm×360 mm).

The substrate (a substrate on which an anode and an insulator which covers an end part of the anode were disposed) which was set to the cassette chamber is transferred to the transfer chamber 518.

In addition, before it was set to the cassette chamber, for the purpose of reducing point defects, it is preferable to clean a surface of a first electrode (anode) by a porous sponge (representatively, made by PVA (polyvinyl alcohol), made by nylon, etc.) in which a surface-active agent (alkalescent) was contained, and to remove dusts on the surface. As a cleaning mechanism, a cleaning apparatus having a roll brush (made by PVA) which is turned around an axial line in parallel with a surface of the substrate and is in contact with the surface of the substrate may be used, and a cleaning apparatus having a disk brush (made by PVA) which is in contact with a surface of the substrate over turning around an axis line which is perpendicular to the surface of the substrate may be used. In addition, prior to forming a film, which includes an organic compound, in order to remove moisture and another gas which are included in the above-described substrate, it is preferable to carry out anneal for deairing in vacuum, and it is transferred to the pretreatment chamber 523 which was coupled to the transfer chamber 518, and anneal may be carried out there.

Then, it is transferred from the transfer chamber 518 in which a substrate transfer mechanism was disposed, to a loading chamber 501. In the manufacturing apparatus of this embodiment, in the loading chamber 501, a substrate inverting mechanism is provided, and it is possible to invert the substrate properly. The loading chamber 501 is coupled to a vacuum pumping processing chamber, and it is preferable that, after vacuum pumping was carried out, inert gas is introduced to realize an atmospheric pressure.

Then, it is transferred to the transfer chamber 502 which was coupled to the loading chamber 501. In order that moisture and oxygen do not exist in the transfer chamber 502 to the utmost, it is preferable that it has been vacuated in advance, and vacuum has been maintained.

In addition, as the above-described vacuum pumping processing chamber, a magnetic levitation type turbo molecular pump, a cryopump, or a dry pump is provided. By this, it is possible to set ultimate vacuum of the transfer chamber which was coupled to the loading chamber to $10^{-5}$-$10^{-6}$ Torr, and further, it is possible to control back diffusion of an impurity from a pump side and an air exhaust system. In order to prevent an impurity from being introduced into an apparatus inside, as gas to be introduced, inert gas such as nitrogen and rare gas is used. As these gasses which are introduced into an apparatus inside, used is one which was highly purified by a gas purification machine, before it is introduced into an apparatus. Therefore, there is a necessity of having a gas purification machine so that gas is introduced into a deposition apparatus after it was highly purified. By this, since it is possible to remove an impurity such as oxygen, water and others, which is included in gas, in advance, it is possible to prevent these impurities from being introduced into an apparatus.

In addition, in case that it is desired to remove a film including an organic compound, which was formed at an unnecessary place, it is transferred to the pretreatment chamber 503a, and a lamination layer of organic compound films may be selectively removed. The pretreatment chamber 503a has plasma generating means, and generates plasma by exciting one kind or a plurality kinds of gasses, which were selected from Ar, H, F, and O, and thereby, carries out dry etching. In addition, a UV irradiating mechanism may be disposed in the pretreatment chamber 503a so that ultraviolet ray irradiation can be carried out as an anode surface treatment.

In addition, in order to eliminate shrink, it is desirable to carry out vacuum heating right before deposition of a film which includes an organic compound, and it is transferred to the pretreatment chamber 503b, and in order to completely remove moisture and other gas which are included in the above-described substrate, anneal for deairing is carried out in vacuum ($5\times10^{-3}$ Torr (0.665 Pa) or less, preferably, $10^{-4}$-$10^{-6}$ Torr). In the pretreatment chamber 503b, by using a flat plate heater (representatively, sheath heater), a plurality of substrates are heated uniformly. In particular, in case that an organic resin film was used as a material of an interlayer insulating film and a partition wall, since there is such fear that, according to an organic resin material, it absorbs moisture easily, and further, degasification is generated, it is useful to carry out vacuum heating for removing absorbed moisture by carrying out natural cooling for 30 minutes, after heating of, for example, 30 minutes or more was carried out with 100° C.-250° C., preferably, 150° C.-200° C. before a layer including an organic compound is formed.

Then, after the above-described vacuum heating was carried out, the substrate is transferred from the transfer chamber 502 to the hand-over chamber 505, and further, the substrate is transferred from the hand-over chamber 505 to the transfer chamber 504a, without contact with atmospheric air.

After that, the substrate is properly transferred to the film forming chambers 506R, 506G, 506B, 506E, which were coupled to the transfer chamber 504a, and formed properly is an organic compound layer which comprises low molecules which become a hole injection layer, a hole transport layer, a light emitting layer, an electron transport layer, or an electron injection layer. In addition, it is also possible to transfer the substrate from the transfer chamber 502 to the film forming chamber 506H, and to carry out deposition.

In addition, in the film forming chamber 512, a hole injection layer, which comprises a polymeric material, may be formed by an ink-jet method and a spin coating method. In addition, the substrate is placed vertically, and a film may be formed by an ink-jet method in vacuum. Over a first electrode (anode), poly(ethylene dioxythiophene)/poly(styrene sulfonic acid) aqueous solution (PEDOT/PSS), polyaniline/camphoric sulfonic acid aqueous solution (PANI/CSA), PTP-DES, Et-PTPDEK, or PPBA and so on, which act as a hole injection layer (anode buffer layer), may be applied to an entire surface and baked. On the occasion of baking, it is preferable to be carried out in a bake chamber 523. In case that a hole injection layer, which is composed of a polymeric material, was formed by an application method which used a spin coat and so on, a flatness property is improved, and it is possible to make coverage and film thickness uniformity of a film to be formed on it, better. In particular, since a film thickness of a light emitting layer becomes uniform, it is possible to obtain uniform light emission. In this case, it is desirable that, after the hole injection layer was formed by the application method, right before film formation by a deposition method, vacuum heating (100-200° C.) is carried out. On the occasion of carrying out vacuum heating, it may be carried out in the pretreatment chamber 503b. For example, a surface of a first electrode (anode) was cleaned by a sponge, it is transferred to the cassette chamber, and transferred to the film forming chamber 512, and poly(ethylene dioxythiophene)/poly(styrene sulfonic acid) aqueous solution (PEDOT/PSS) was applied to an entire surface with a film thickness 60 nm, and thereafter, it is transferred to the bake chamber 523, and tentatively baked at 80° C., for 10 minutes, and really baked at 200° C., for 1 hour, and further, it was transferred to the pretreatment chamber 503b, and vacuum heating (170° C., heating 30 minutes, cooling 30 minutes) was carried out right before deposition, and thereafter, it is transferred to the film forming chambers 506R, 506G, 506B, and without contact with atmospheric air, formation of a light emitting layer may be carried out by a deposition method. In particular, in case that an ITO film is used as an anode material, and concavity and convexity, and minute particles exist on a surface, by setting a film thickness of PEDOT/PSS to a film thickness of 30 nm or more, it is possible to reduce influence of these.

In addition, since a wet property is not so good when PEDOT/PSS was applied over the ITO film, it is desirable to improve the wet property by carrying out cleaning by purified water once, after first time application of the PEDOT/PSS aqueous solution was carried out by a spin coating method, and to carry out second time application of the PEDOT/PSS aqueous solution by a spin coating method, and to carry out baking so as to form a film with good uniformity. In passing, by carrying out cleaning by purified water once, after the first time application was carried out, obtained is such an advantage that a surface is modified, and minute particles etc. can be also removed.

In addition, in case that PEDOT/PSS was formed as a film by a spin coating method, since the film is formed over an entire surface, it is preferable to selectively remove an end surface and a peripheral part of a substrate, a terminal part, a connection region of a cathode and a lower part wiring, and so on, and it is preferable to remove by $O_2$ ashing in the pretreatment chamber 503a.

Here, the film forming chambers 506R, 506G, 506B, 506E, 506H will be described.

In each film forming chamber 506R, 506G, 506B, 506E, 506H, a movable deposition source holder (deposition cell) is installed. That is, it corresponds to the film forming chamber of the above-described embodiment mode 2, which was shown in FIG. 2. As shown in the above-described embodiment mode 2, deposition is carried out over introducing material gas on the occasion of deposition. As the material gas, concretely speaking, one kind or a plurality of kinds, which were selected from silane series gas (monosilane, disilane, trisilane etc.), $SiF_4$, $GeH_4$, $GeF_4$, $SnH_4$, or hydro carbon series gas ($CH_4$, $C_2H_2$, $C_2H_4$, $C_6H_6$ etc.), may be used. By intentionally introducing material gas at the time of film formation, and by having a component of the material gas included in an organic compound film, it is possible to make a high-density film. By having a component of a material gas included in an organic compound film, it is possible to block an impurity such as oxygen and moisture which causes deterioration from being intruded, diffused in a film, and to improve reliability of a light emitting device.

In passing, as to this deposition source holder, a plurality of them are prepared, and a plurality of containers (crucibles) in which EL materials were sealed are properly provided, and they are disposed in the film forming chamber in this state. By setting a substrate by a face-down system, and by carrying out positional alignment of a deposition mask by CCD etc., and by carrying out deposition by a resistance heating method, it is possible to carry out film formation selectively. In passing, a deposition mask is stocked in the mask stock chamber 524, and transferred to the film forming chamber on the occasion of carrying out deposition. In addition, the film forming chamber 532 is an auxiliary deposition chamber for forming a layer including an organic compound and a metal material layer.

Figure 7:
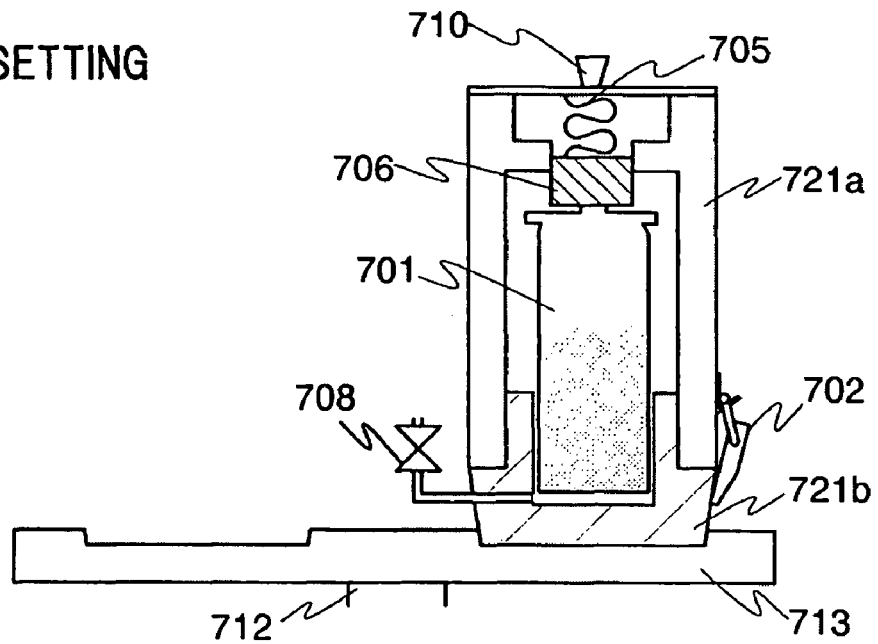
FIGS. 7A and 7B are views showing a crucible transfer in an installation chamber showing the embodiment 2.
Figure 7:
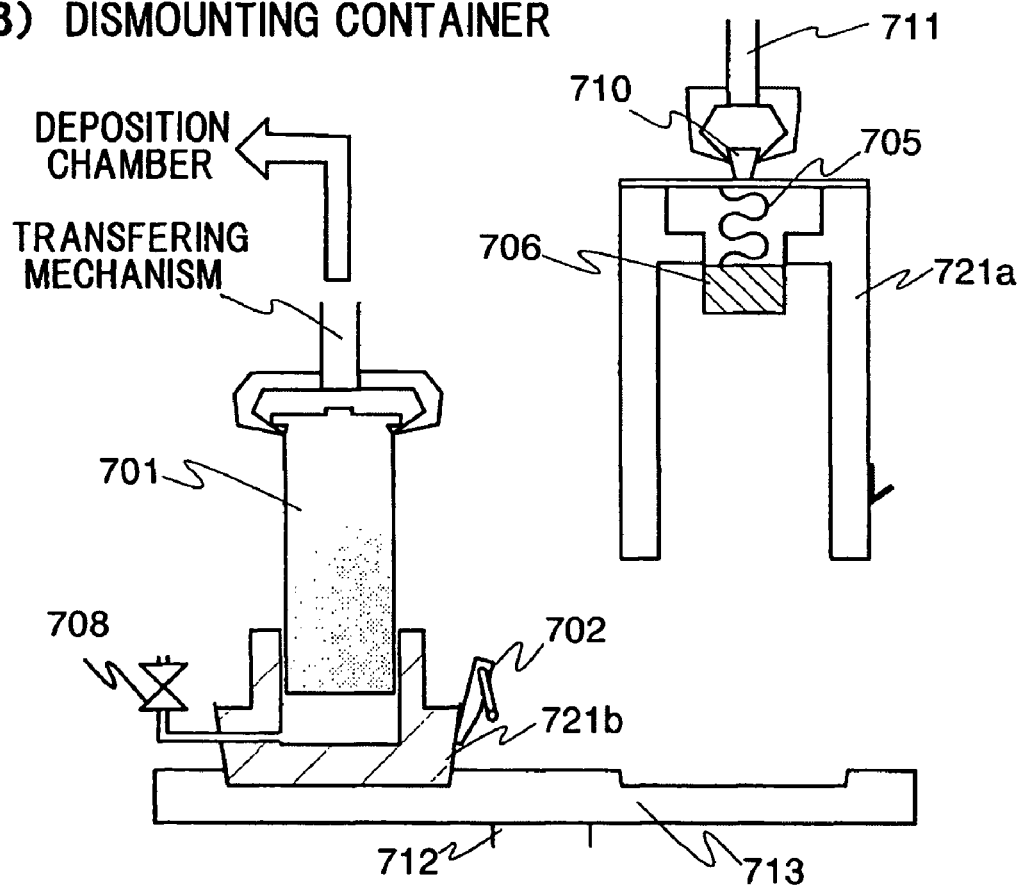
Figure 8:
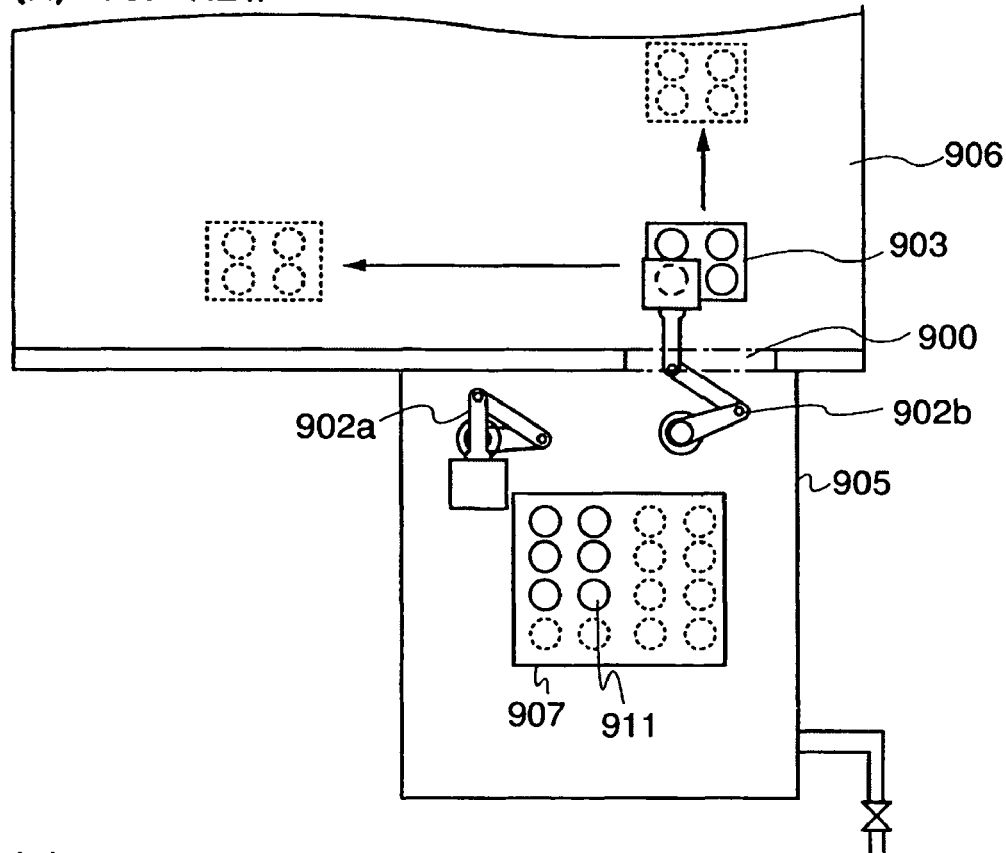
FIGS. 8A and 8B are views showing a crucible transfer to a deposition source holder in the installation chamber showing the embodiment 2.
Figure 8:
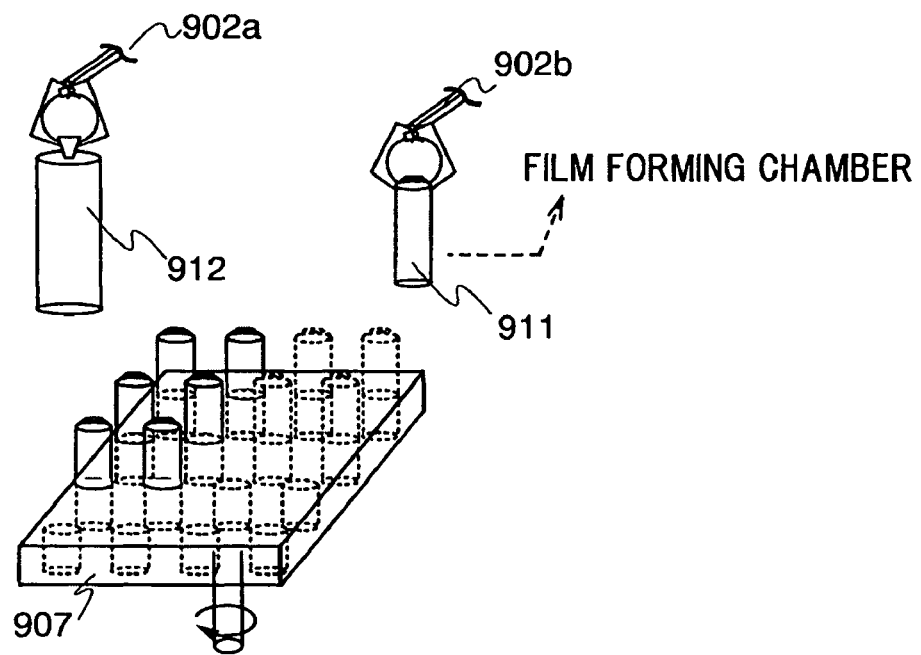

For installation of EL materials in these film forming chambers, it is preferable to use a manufacturing system which is hereinafter shown. That is, it is preferable to carry out film formation by using a container (representatively, crucible) in which an EL material has been accommodated in advance by a material maker. Further, on the occasion of installation, it is preferable to carry out without contact with atmospheric air, and on the occasion that it is transferred from a material maker, it is preferable to be introduced into the film forming chamber, in a state that the crucible is sealed hermetically in a second container. Preferably, the installation chambers 526R, 526G, 526B, 526H, 526E having vacuum pumping means coupled to each film forming chamber 506R, 506G, 506B, 506H, 506E are made to form vacuum or, inert gas atmosphere, and in this, the crucible is pulled out from the second container, and the crucible is installed in the film forming chamber. In passing, one example of the installation chamber is shown in FIG. 7, or FIG. 8.

Here, a figuration of a container for transferring will be concretely described by use of FIG. 7(A). The second container which is used for transfer and divided into a upper part (721a) and a lower part (721b) has fixing means 706 for fixing the first container which was disposed on the upper part of the second container, a spring 705 for pressurizing the fixing means, a gas feed port 708 which was disposed on the lower part of the second container and which becomes a gas path for reducing and maintaining pressure of the second container, an O ring for fixing a upper part container 721a and a lower part container 721b, and a fastener 702. In this second container, installed is the first container 701 in which a purified deposition material was sealed. In passing, the second container may be formed by a material including stainless, and the first container 701 may be formed by material having titanium.

In a material maker, the purified deposition material is sealed in the first container 701. And, through the O ring, the second upper part 721a and lower part 721b are matched, and the upper part container 721a and the lower part container 721b are fixed by the fastener 702, and the first container 701 is sealed hermetically in the second container. After that, through the gas feed port 708, pressure in the second container is reduced, and further, it is replaced by nitrogen atmosphere, and the spring 705 is adjusted, and the first container 705 is fixed by the fixing means 706. In this manner, when an inside of the second container is held as vacuum, and reduced pressure, nitrogen atmosphere, it is possible to prevent even attachment of slight oxygen and water to the deposition material.

In this state, it is transferred to a light emitting apparatus maker, and the first container 701 is installed in a deposition chamber. After that, by heating, a deposition material is sublimated, and film formation of a deposition film is carried out.

In addition, it is preferable that other components, e.g., a film thickness monitor (crystal oscillator etc.), a shutter, and so on are transferred in the same manner without contact with atmospheric air, and installed in a deposition apparatus.

In addition, an installation chamber for pulling out the crucible (filled with a deposition material) which was vacuum-sealed in the container without contact with atmospheric air, and for setting the crucible to a deposition holder is coupled to a film forming chamber, and the crucible is transferred from the installation chamber by a transfer robot without contact with atmospheric air. It is preferable that vacuum pumping means is also disposed in the installation chamber, and further, means for heating the crucible is also disposed.

By use of FIG. 7(A) and FIG. 7(B), a mechanism of installing the container 701, which is sealed hermetically in the second container 721*a*, 721*b* and transferred, in the film forming chamber will be described.

FIG. 7(A) describes a cross-section surface of the installation chamber 705 which has a rotation table 707 over which the second container 721*a*, 721*b*, in which the first container was accommodated, is mounted, a transfer mechanism for transferring the first container, and a lift mechanism 711. In addition, the installation chamber is allocated so as to be adjacent to the film forming chamber, and it is possible to control atmosphere of the installation chamber by means for controlling atmosphere through the gas feed port. In passing, the transfer mechanism is not limited to such a configuration that the first container is sandwiched (pinched) from a upper side of the first container 701 as described in FIG. 7(B), and may be of such a configuration that the first container is transferred by sandwiching side surfaces thereof.

In the above installation chamber, in such a state that the fastener 702 was released, the second container is allocated over a rotational installation table 713. Since an inside is in a vacuum state, even if the fastener 702 was released, it does not move. Then, by the means for controlling atmosphere, an inside of the installation is made to be in a reduced pressure state. When a pressure in the installation chamber and a pressure in the second container become equal, it becomes such a state that a seal of the second container can be easily broken. And, by the lift mechanism 711, the upper part 721*a* of the second container is dismounted, and the rotational installation table 713 is rotated around a rotation axis 712 as an axis, and thereby, the lower part of the second container, and the first container are moved. And, the first container 701 is transferred to the deposition chamber by the transfer mechanism, and the first container 701 is installed on a deposition source holder (not shown in the figure).

After that, by heating means which was disposed in the deposition source holder, a deposition material is sublimated, and film formation is initiated. At the time of this film formation, when a shutter (not shown in the figure), which was disposed in the deposition source holder, is opened, the sublimed deposition material flies in a direction of the substrate, and is deposited over the substrate, and a light emitting layer (including a hole transport layer, a hole injection layer, an electron transport layer, an electron injection layer) is formed.

And, after deposition was completed, the first container is lifted from the deposition source holder, and transferred to the installation chamber, and mounted over the lower part container (not shown in the figure) of the second container which was placed over a rotation table 804, and sealed hermetically by the upper part container 721*a*. At this time, it is preferable to seal the first container, the upper part container, and the lower part container hermetically, by transferred combination. In this state, the installation chamber 805 is made to be of atmospheric pressure, and the second container is pulled out from the installation chamber, and the fastener 702 is fixed, and transferred to a material maker.

In addition, an example of an installation chamber in which a plurality of first containers 911 can be installed is shown in FIG. 8. In FIG. 8(A), the installation chamber 905 has a rotation table 907 on which it is possible to mount a plurality of the first containers 911 or second containers 912, a transfer mechanism 902*b* for transferring the first container, and a lift mechanism 902*a*, and a film forming chamber 906 has a deposition source holder 903, and a mechanism (here, not shown in the figure) for moving a deposition holder. FIG. 8(A) shows a top view, and FIG. 8(B) shows a perspective view of an inside of the installation chamber. In addition, the installation chamber 905 is placed through a gate valve 900 so as to be adjacent to the film forming chamber 906, and it is possible to control atmosphere of the installation chamber, by means for controlling atmosphere, through a gas feed port. In passing, although it is not shown in the figure, a place in which a upper part (second container) 912, which was dismounted, is placed is disposed separately.

Or, it may be designed in such a manner that a robot is provided in a pretreatment chamber (installation chamber) which was coupled to the film forming chamber, and a deposition source in its entirety is moved from the film forming chamber to the pretreatment chamber, and in the pretreatment chamber, a deposition material is set to the deposition source. That is, it may be designed as a manufacturing apparatus in which a deposition source is moved up to a pretreatment chamber. By doing this, it is possible to set the deposition source, with holding a cleaning degree of the film forming chamber.

By doing this, it is possible to prevent a crucible and an EL material, which was accommodated in the crucible, from being contaminated. In passing, in the installation chambers 526R, 526G, 526B, 528H, 526E, it is possible to stock a metal mask.

By properly selecting EL materials which are placed in the film forming chambers 506R, 506G, 506B, 506H, 506E, as an entire light emitting device, it is possible to form a light emitting device which indicates light emission of a single color (concretely, white color), or full color (concretely, red color, green color, blue color). For example, in case of forming a green color light emitting device, if a cathode is formed, after a hole transport layer or a hole injection layer in the film forming chamber 506H, and a light emitting layer (G) in the film forming chamber 506G, and an electron transport layer or an electron injection layer in the film forming chamber 506E were sequentially laminated, it is possible to obtain the green color light emitting device. For example, in case of forming a full color light emitting device, if a cathode is formed after, using a deposition mask for R in the film forming chamber 506R, a hole transport layer or a hole injection layer, a light emitting layer (R), an electron transport layer or an electron injection layer are sequentially laminated, and using a deposition mask for G in the film forming chamber 506G, a hole transport layer or a hole injection layer, a light emitting layer (G), an electron transport layer or an electron injection layer are sequentially laminated, and using a deposition mask for B in the film forming chamber 506B, a hole transport layer or a hole injection layer, a light emitting layer (B), an electron transport layer or an electron injection layer are sequentially laminated, it is possible to obtain the full color light emitting device.

In passing, an organic compound layer for indicating light emission of white color is, in case of laminating light emission layers having different light emission colors, roughly classified into a 3 wavelength type which includes 3 primary colors of red color, green color, blue color, and a 2 wavelength type which used a relation of complementary colors of blue color/yellow color, or blue-green color/orange color. It is possible to form a white color light emitting device in one film forming chamber. For example, in case of obtaining the white color light emitting device using the 3 wavelength type, prepared is a film forming chamber in which provided were a plurality of deposition source holders on which a plurality of crucibles were mounted, and in a first deposition source holder, aromatic diamine (TPD) is sealed, and in a second deposition source holder, p-EtTAZ is sealed, and in a third deposition source holder, $Alq_3$ is sealed, and in a fourth deposition source holder, an EL material in which NileRed, which is a red color light emitting coloring matter, was added to $Alq_3$, and in a fifth deposition source holder, $Alq_3$ is sealed, and in this state, they are installed in each film chamber. And, the first through fifth deposition source holders starts moving in sequence, and carry out deposition to a substrate, and lamination of layers. Concretely speaking, TPD is sublimated from the first deposition source holder by heating, and deposited on an entire surface of the substrate. After that, p-EtTAZ is sublimated from the second deposition source holder, and $Alq_3$ is sublimated from the third deposition source holder, and $Alq_3$:NileRed is sublimated from the fourth deposition source holder, and $Alq_3$ is sublimated from the fifth deposition source holder, and deposited over an entire surface of the substrate. After that, if a cathode is formed, it is possible to obtain the white color light emitting device.

By the above-described process, after layers including organic compounds are laminated as layers properly, the substrate is transferred from the transfer chamber 504 to the hand-over chamber 507, and further, the substrate is transferred from the hand-over chamber 507 to the transfer chamber 508, without contact with atmospheric air.

Then, by the transfer mechanism which is disposed in the transfer chamber 508, the substrate is transferred to the film forming chamber 510, and a cathode is formed. This cathode is a metal film (alloy such as MgAg, MgIn, $CaF_2$, LiF, CaN, or a film formed by a co-deposition method of an element which belongs to a 1 family or a 2 family of the periodic table and aluminum, or a laminated film of these) which is formed by a deposition method which used resistance heating. In addition, a cathode may be formed by using a sputtering method.

In addition, in case of fabricating a upper surface launching type light emitting device, it is desirable that a cathode is transparent or semi-transparent, and it is desirable that a thin film (1 nm-10 nm) of the above-described metal film, or a laminated layer of a thin film (1 nm-10 nm) of the above-described metal film and a transparent conductive film is used as the cathode. In this case, by using the sputtering method, a film, which is composed of a transparent conductive film (ITO(indium oxide-tin oxide alloy), indium oxide-zinc oxide alloy ($In_2O_3$—ZnO), zinc oxide (ZnO) etc.), may be formed in the film forming chamber 509.

By the above-described processes, a light emitting device of a laminated layer configuration is formed.

In addition, it may be designed that it is transferred to the film forming chamber 513 which was coupled to the transfer chamber 508, and a protective film, which is composed of a silicon nitride film, or a silicon nitride oxide film, is formed for sealing. Here, in the film forming chamber 513, a target which is composed of silicon, or a target which is composed of silicon oxide, or a target which is composed of silicon nitride, is provided. For example, using the target which is composed of silicon, by changing film forming chamber atmosphere to nitrogen atmosphere or atmosphere including nitrogen and argon, it is possible to form a silicon nitride film on a cathode. In addition, it may be formed by use of a thin film in which a major component is carbon (a DLC film, a CN film, an amorphous carbon film) as a protective film, and a film forming chamber which used a CVD method may be disposed separately. A diamond like carbon film (also called as DLC film) can be formed by a plasma CVD method (representatively, a RF plasma CVD method, a microwave CVD method, an electron cyclone resonance (ECR) CVD method, a heat filament CVD method etc.) a combustion-flame method, a sputtering method, an ion beam deposition method, a laser deposition method, etc. As reactive gas which is used for film formation, used are hydrogen gas, and carbon hydride series gas (e.g., $CH_4$, $C_2H_2$, $C_2H_6$ etc.), and it is ionized by glow discharge, and ions are accelerated and bombarded to a cathode to which a negative self bias was applied, to form a film. In addition, the CN film may be formed by using $C_2H_4$ gas and $N_2$ gas as reactive gas. In passing, the DLC film and the CN film are insulating films which are transparent or semi-transparent to visible light. To be transparent to visible light means that a transmission factor of visible light is 80-100%, and to be semi-transparent to visible light means that a transmission factor of visible light is 50-80%.

In this embodiment, on a cathode, a protective layer, which comprises a laminated layer of a first inorganic insulating film, a stress relaxing film, and a second inorganic insulating film, is formed. For example, it may be designed that, after the cathode was formed, it is transferred to the film forming chamber 513, and the first inorganic insulating film is formed, and it is transferred to the film forming chamber 532, and the stress relaxing film (a layer including an organic compound, etc.) which has a hygroscopic property and transparency is formed by a deposition method, and further, it is transferred again to the film forming chamber 513, and the second inorganic insulating film is formed.

Then, the substrate on which a light emitting device was formed, is transferred from the transfer chamber 508 to the hand-over chamber 511, without contact with atmospheric air, and further, transferred from the hand-over chamber 511 to the transfer chamber 514. Then, the substrate on which a light emitting device was formed, is transferred from the transfer chamber 514 to the sealing chamber 516.

A seal substrate is set from outside to the load chamber 517, and prepared. In passing, in order to remove an impurity such as moisture, it is desirable to carry out anneal in advance in vacuum. And, in case of forming a seal member for gluing the substrate on which a light emitting device was formed with the seal substrate, the seal member is formed in the sealing chamber 527, and the seal substrate, on which the seal member was formed, is transferred to the seal substrate stock chamber 530. In passing, in the sealing chamber, a drying agent may be disposed over the seal substrate. In passing, here, an example, in which the seal member was formed over the seal substrate, was shown, but in particular, it is not restrictive, and the seal member may be formed on the substrate on which a light emitting device was formed.

Then, the sealing chamber 516, the substrate and the seal substrate are glued together, and UV rays are irradiated to a pair of the glued substrates by a ultraviolet ray irradiating mechanism which was disposed in the sealing chamber 516, to cure the seal member. In passing, here, as the seal member, ultraviolet ray cured resin was used, but if it is an adhesive agent, it is not particularly restrictive.

Then, the pair of glued substrates are transferred from the sealing chamber 516 to the transfer chamber 514, and then, from the transfer chamber 514 to the pull-out chamber 519, and then, pulled out.

As above, by using the manufacturing apparatus shown in FIG. 6, until a light emitting device is completely sealed in a hermetically enclosed space, it is not needed to be exposed to atmospheric air, and therefore, it becomes possible to fabricate a light emitting apparatus with high reliability. In passing, in the transfer chambers 514, 518, vacuum, and nitrogen atmosphere with atmospheric pressure are repeated, but, it is desired that vacuum is maintained on a steady basis in the transfer chambers 502, 504, 508.

In passing, although it is not shown in the figure here, disposed is a control control apparatus for realizing automation by controlling a path through which the substrate is moved to an individual processing chamber.

In addition, in the manufacturing apparatus shown in FIG. 6, the substrate, on which a transparent conductive film (or a metal film (TiN)) was disposed as an anode, is carried in, and a layer including an organic compound was formed, and thereafter, a transparent or semi-transparent cathode (e.g., a laminated layer of a thin metal film (Al, Ag) and a transparent conductive film) is formed, and thereby, it is also possible to form a upper surface launching type (or upper/lower surfaces launching type) light emitting device. In passing, the upper surface launching type light emitting device means a device which gets through a cathode and pulls out emitted light which was generated in an organic compound layer.

In addition, in the manufacturing apparatus shown in FIG. 6, the substrate, on which a transparent conductive film was formed as an anode, is transferred, and after a layer including an organic compound was formed, a cathode, which comprising a metal film (Al, Ag), is formed, and thereby, it is also possible to form a lower surface launching type light emitting device. In passing, the lower surface launching type light emitting device means a device which pulls out emitted light which was generated in an organic compound layer from an anode which is a transparent electrode toward TFT, and further, which gets it through the substrate.

In addition, it is possible to freely combine this embodiment with the embodiment mode 1, the embodiment mode 2, the embodiment mode 3, the embodiment mode 4 or the embodiment 1.

Embodiment 3

Figure 9:
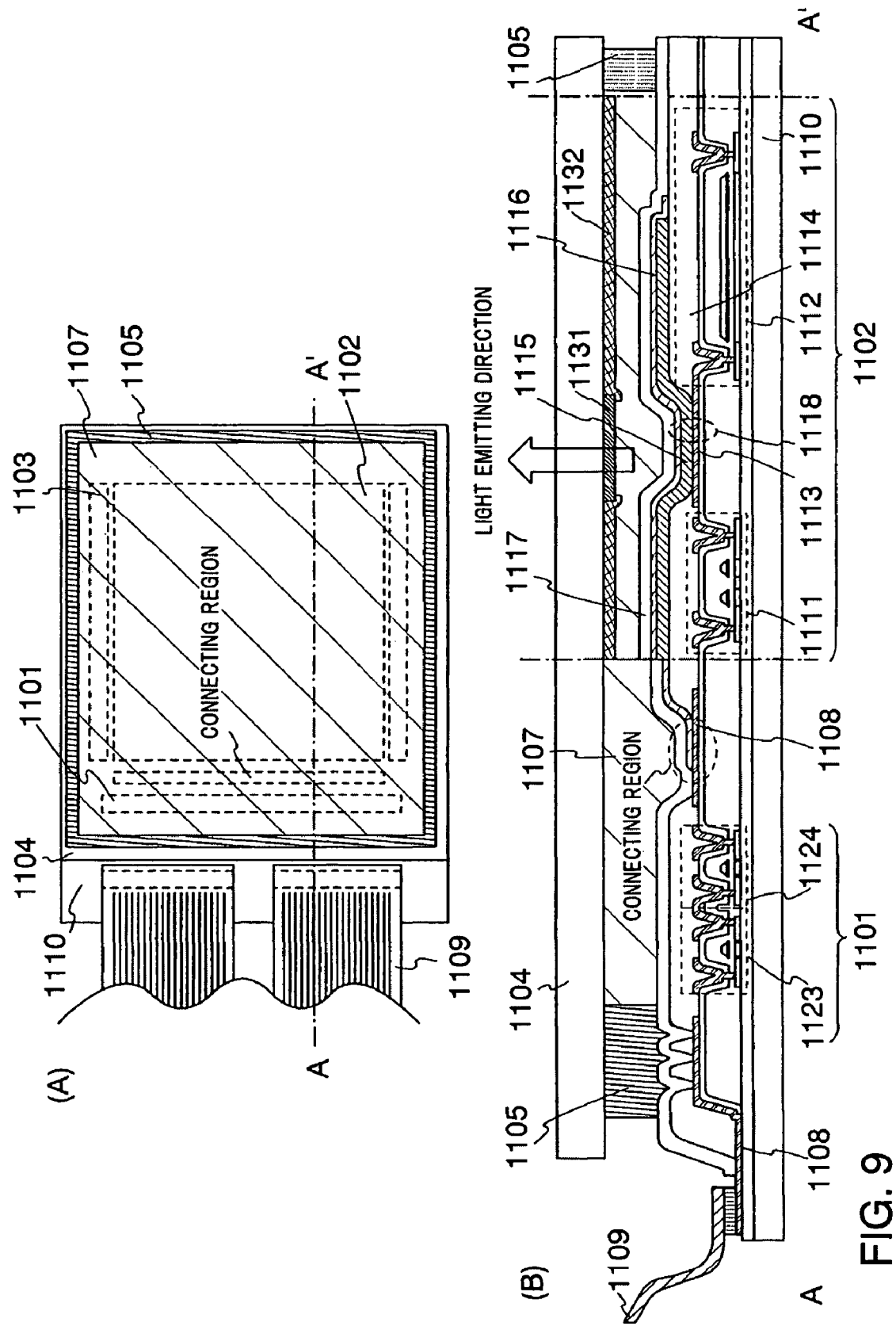
FIGS. 9A and 9B are views showing an embodiment 3.

In this embodiment, an example for fabricating a light emitting apparatus (upper surface launching configuration) which had a light emitting device in which an organic compound layer is used as a light emitting layer, on a substrate which has an insulating surface is shown in FIG. 9.

In passing, FIG. 9(A) is a top view showing a light emitting apparatus, and FIG. 9(B) is a cross-sectional view in which FIG. 9(A) was cut with A-A'. 1101 shown by a dotted line designates a source signal line drive circuit, and 1102 designates a pixel portion, and 1103 designates a gate signal line drive circuit. In addition, 1104 designates a transparent seal substrate, and 1105 designates a first seal member, and an inside which was surrounded by the first seal member is filled with a transparent second seal member 1107. In passing, in the first seal member 1105, included is a gap member for holding a substrate interval.

In passing, 1108 designates a wiring for transferring a signal which is imputed to the source signal line drive circuit 1101 and the gate signal line drive circuit 1103, and it accepts a video signal and a clock signal from FPC (Flexible Print Circuit) 1109 which becomes an external input terminal. In passing, here, only FPC is shown in the figure, but a printed wiring board (PWB) may be attached to this FPC.

Next, a cross-sectional configuration will be described by use of FIG. 9(B). A drive circuit and a pixel portion are formed over a substrate 1110, but here, the source signal line drive circuit 1101 as the drive circuit and the pixel part 1102 are shown.

In passing, in the source signal line drive circuit 1101, formed is a CMOS circuit in which a n-channel type TFT 1123 and a p-channel type TFT 1124 were combined. In addition, TFT which forms the drive circuit may be formed by publicly known CMOS circuit, PMOS circuit or NMOS circuit. In addition, in this embodiment, shown was a driver integral type in which a drive circuit was formed over a substrate, but it is not necessary required, and it is possible to form outside not but over the substrate. In addition, a configuration of TFT in which a polysilicon film is used as an active layer is not particularly restrictive, and may be a top gate type TFT, and may be a bottom gate type TFT.

In addition, the pixel portion 1102 is formed by a plurality of pixels which includes a switching TFT 1111, a current control TFT 1112, and a first electrode (anode) 1113 which was electrically connected to its drain. As the current control TFT 1112, either a n-channel type TFT or a p-channel type TFT may be acceptable, but in case that it is connected to an anode, it is desirable to use a p-channel type TFT. In addition, it is desirable to properly dispose holding capacity (not shown in the figure). In passing, here, among pixels which were placed in countless numbers, only a cross-sectional configuration of one pixel was shown, and an example in which 2 TFTs were used for that one pixel was shown, but TFTs of 3 pieces, or more than that, may be properly used.

Here, since it is of such a configuration that the first electrode 1113 is in directly contact with a drain of TFT, it is desirable that a lower layer of the first electrode 1113 is made to be a material layer which can take an ohmic contact with a drain which comprises silicon, and a top layer which is in contact with a layer including an organic compound comprises a material with a large work function. For example, if realized is a 3 layer configuration of a titanium nitride film, a film whose main component is aluminum, and a titanium nitride film, resistance as a wiring is low, and a good ohmic contact is taken, and it is possible to function as an anode. In addition, the first electrode 1113 may be a single layer of a titanium nitride film, a chromium film, a tungsten film, a Zn film, a PT film and so on, and a laminated layer of 3 layers or more may be used.

In addition, over both sides of the first electrode (anode) 1113, formed is an insulator (called as bank, partition wall, barrier, mound) 1114. The insulator 1114 may be formed by an organic resin film or an insulating film which includes silicon. Here, as the insulator 1114, using a positive type photosensitive acryl resin film, an insulator of a shape shown in FIG. 9 is formed.

In order to make a coverage better, it is designed in such a manner that a curved surface having curvature is formed on a upper end part or a lower end part of the insulator 1114. For example, in case that positive type photosensitive acryl was used as a material of the insulator 1114, it is desirable to make only the upper end part of the insulator 1114 hold a curved surface having a curvature radius (0.2 μm-3 μm). In addition, as the insulator 1114, it is possible to use any one of a negative type which becomes irresolvable in etchant by photosensitive light, and a positive type which becomes resolvable in etching by light.

In addition, the insulator 1114 may be covered with a protective film which comprises an aluminum nitride film, an aluminum oxide film, a thin film whose main component is carbon, or a silicon nitride film.

In addition, on the first electrode (anode) 1113, a layer 1115 which includes an organic compound is selectively formed by a deposition method, over introducing monosilane gas. Further, over the film 1115 which includes an organic compound, a second electrode (cathode) 1116 is formed. As the cathode, a material with a small work function (Al, Ag, Li, Ca, or these alloys MgAg, MgIn, AlLi, $CaF_2$, or CaN) may be used. Here, in order that emitted light is penetrated, as the second electrode (cathode) 1116, used is a laminated layer of a metal thin film whose film thickness was thinned, and a transparent conductive electrode (ITO(indium oxide-tin oxide alloy), indium oxide-zinc oxide alloy($In_2O_3$—ZnO), zinc oxide(ZnO) etc.). In this manner, a light emitting device 1118, which comprises the first electrode (anode) 1113, the layer 1115 which includes an organic compound, and the second electrode (cathode) 1116, is formed. In this embodiment, as the layer 1115 which includes an organic compound, an aromatic diamine layer(TPD), a p-EtTAZ layer, an $Alq_3$ layer, an $Alq_3$ layer in which Nile red was doped, and an $Alq_3$ layer are laminated in sequence, to obtain white color light emission. In this embodiment, since the light emitting device 1118 is an example of white color light emission, a color filter (for the purpose of simplification, an overcoat layer is not shown in the figure, here), which comprises a color layer 1131 and a light shielding layer (BM) 1132, is disposed.

In addition, if layers including organic compounds by which light emissions of R, G, B are obtained is selectively formed, it is possible to obtain full-color display even if a color filter is not used.

In addition, in order to seal the light emitting device 1118, a transparent protective layer 1117 is formed. As this transparent protective layer 1117, it is preferable to use an insulating film which is obtained by a sputter method (DC system or RF system) and a PCVD method and in which silicon nitride or silicon nitride oxide is a main component, a thin film in which carbon is a main component (DLC film, CN film etc.), or a laminated layer of these. If formed in atmosphere including nitrogen and argon, using a silicon target, it is possible to obtain a silicon nitride film with a high blocking effect against an impurity such as moisture and alkali metal. In addition, a silicon nitride target may be also used. In addition, the transparent protective layer may be also formed by using a film forming apparatus which used remote plasma. In addition, in order to have emitted light penetrate through the transparent protective layer, it is preferable that a film thickness of the transparent protective layer is as thin as possible.

In addition, in order to seal the light emitting device 1118, under inert gas, the seal substrate 1104 is glued by the first seal member 1105 and the second seal member 1107. In passing, as the first seal member 1105, the second seal member 1107, it is preferable to use epoxy series resin. In addition, it is desired that the first seal member 1105, and the second seal member 1107 are of a material which does not pass moisture and oxygen as far as possible.

In addition, in this embodiment, as a material which configures the seal substrate 1104, it is possible to use a plastic substrate which comprises FRP(Fiberglass-Reinforced Plastics), PVF(PolyVinyl Fluoride), a mylar, polyester or acryl etc. In addition, after the seal substrate 1104 was glued by using the first seal member 1105 and the second seal member 1107, it is possible to seal by a third seal member, so as to further cover a side surface (exposed surface).

By doing the foregoing, by encapsulating a light emitting device in the first seal member 1105, the second seal member 1107, it is possible to completely shield the light emitting device from outside, and it is possible to prevent a substance such as moisture and oxygen, which urges deterioration of an organic compound layer from being intruded from outside. Therefore, it is possible to obtain a light emitting device with high reliability.

In addition, if a transparent conductive film is used as the fist electrode 1113, it is possible to fabricate a both surface light emission type light emitting apparatus.

In addition, in this embodiment, shown was an example of such a configuration (hereinafter, called as upper surface launching configuration) that a layer, which includes an organic compound, is formed over an anode, and a cathode, which is a transparent electrode, is formed over the layer which includes an organic compound, but a configuration which has a light emitting device in which a layer, which includes an organic compound, is formed over an anode, and a cathode is formed over an organic compound layer, and in which emitted light, which was generated in the layer which includes an organic compound, is pulled out from the anode, which is a transparent electrode, toward TFT (hereinafter, called as lower surface launching configuration) may be used.

Figure 10:
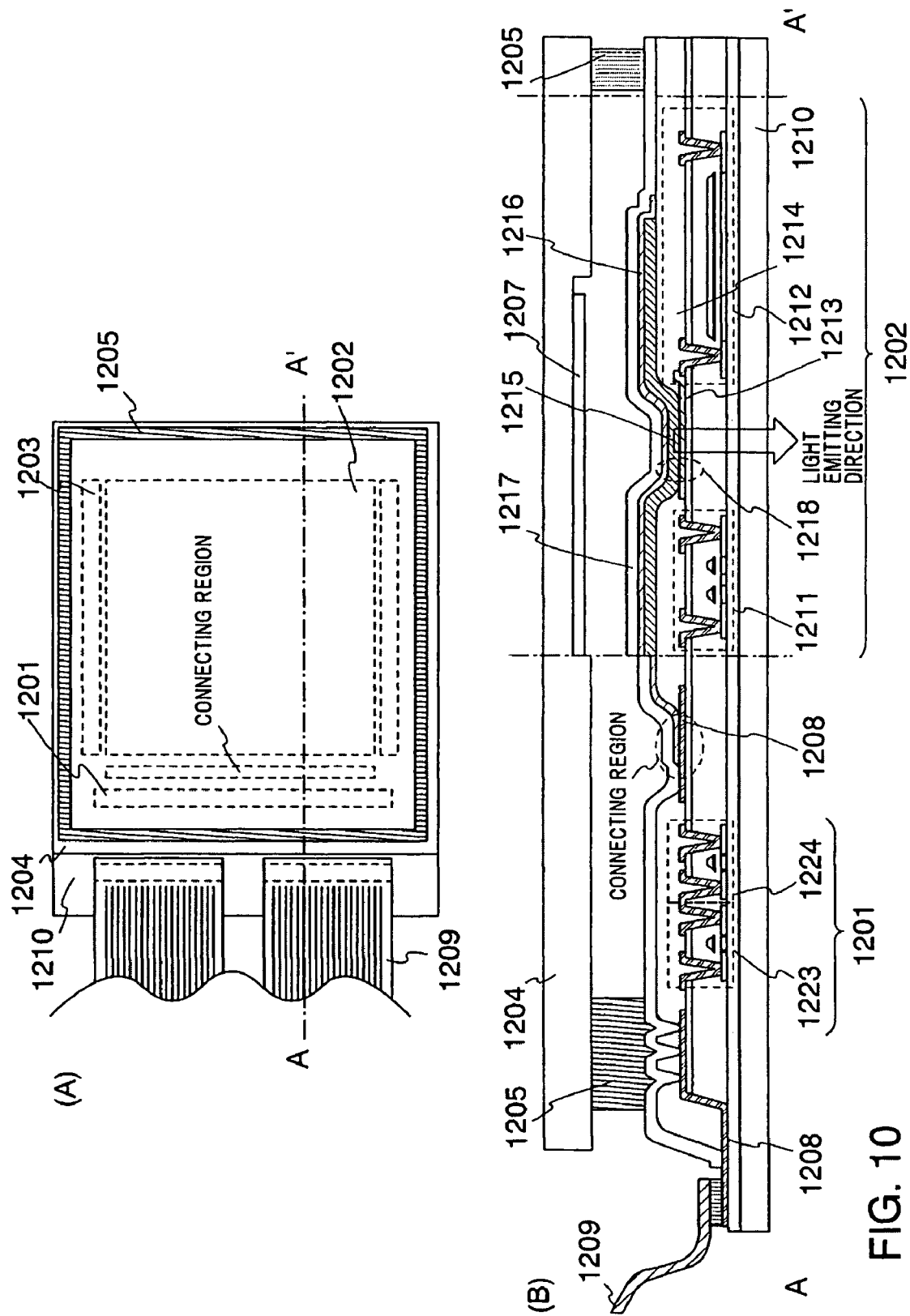
FIGS. 10A and 10B are views showing the embodiment 3.

Here, one example of a light emitting apparatus of the lower surface launching configuration is shown in FIG. 10.

In passing, FIG. 10(A) is a top view showing a light emitting apparatus, and FIG. 10(B) is a cross-sectional view in which FIG. 10(A) was cut along A-A'. 1201 shown by a dotted line designates a source signal line drive circuit, and 1202 designates a pixel portion, and 1203 designates a gate signal line drive circuit. In addition, 1204 designates a seal substrate, and 1205 designates a seal member in which included is a gap member for holding an interval of a hermetically enclosed space, and an inside which was surrounded by the seal member 1205 is filled with inert gas (representatively, nitrogen). As to an inside space which was surrounded by the seal member 1205, minute amounts of moisture is removed by a drying agent 1207, and it is sufficiently dried.

In passing, 1208 designates a wiring for transferring a signal which is imputed to the source signal line drive circuit 1201 and the gate signal line drive circuit 1203, and it accepts a video signal and a clock signal from FPC (Flexible Print Circuit) 1209 which becomes an external input terminal.

Next, a cross-sectional configuration will be described by use of FIG. 10(B). A drive circuit and a pixel portion are formed over a substrate 1210, but here, the source signal line drive circuit 1201 as the drive circuit and the pixel portion 1202 are shown. In passing, in the source signal line drive circuit 1201, formed is a CMOS circuit in which a n-channel type TFT 1223 and a p-channel type TFT 1224 were combined.

In addition, the pixel portion 1202 is formed by a plurality of pixels which includes a switching TFT 1211, a current control TFT 1212, and a first electrode (anode) 1213 which comprises a transparent conductive film electrically connected to its drain.

Here, it is of such a configuration that the first electrode 1213 is formed so as to be partially overlapped with a connection electrode, and the first electrode 1213 is electrically connected to a drain region of TFT through the connection electrode. The first electrode 1213 has transparency, and it is desired to use a conductive film with a large work function (ITO(indium oxide-tin oxide alloy), indium oxide-zinc oxide alloy($In_2O_3$—ZnO), zinc oxide(ZnO) etc.).

In addition, over both ends of the first electrode (anode) 1213, formed is an insulator (called as bank, partition wall, barrier, mound) 1214. In order to make a coverage better, it is designed in such a manner that a curved surface having curvature is formed over a upper end part or a lower end part of the insulator 1214. In addition, the insulator 1214 may be covered with a protective film which comprises an aluminum nitride film, an aluminum nitride oxide film, a thin film in which carbon is a main component, or a silicon nitride film.

In addition, over the first electrode (anode) 1213, a layer 1215 which includes an organic compound is selectively formed by carrying out deposition of an organic compound material, over introducing monosilane gas. Further, over the film 1215 which includes an organic compound, a second electrode (cathode) 1216 is formed. As the cathode, a material with a small work function (Al, Ag, Li, Ca, or these alloys MgAg, MgIn, AlLi, $CaF_2$, or CaN) may be used. In this manner, a light emitting device 1218, which comprises the first electrode (anode) 1213, the layer 1215 which includes an organic compound, and the second electrode (cathode) 1216, is formed. Here, the light emitting device 1218 is one of light emitting devices which can obtain single color light emission of R, G, or B, and fill-color is realized by 3 light emitting devices in which layers, which include organic compounds by which light emissions of R, G, B are obtained, were selectively formed.

In addition, in order to seal the light emitting device 1218, a protective layer 1217 is formed. As this transparent protective layer 1217, it is preferable to use an insulating film which is obtained by a sputter method (DC system or RF system) and a PCVD method and in which silicon nitride or silicon nitride oxide is a main component, or a thin film in which carbon is a main component (DLC film, CN film etc.), or a laninated layer of these. If formed in atmosphere including nitrogen and argon, using a silicon target, it is possible to obtain a silicon nitride film with a high blocking effect against an impurity such as moisture and alkali metal. In addition, a silicon nitride target may be also used. In addition, the protective layer may be also formed by using a film forming apparatus which used remote plasma.

In addition, in order to seal the light emitting device 1218, under inert gas, the seal substrate 1204 is glued by the seal member 1205. In the seal substrate 1204, a concave part, which was formed by a sandblast method, has been formed in advance, and the drying agent 1207 is glued to the concave part. In passing, as the seal member 1205, it is preferable to use epoxy series resin. In addition, it is desired that the seal member 1205 is of a material which does not pass moisture and oxygen as far as possible.

In addition, in this embodiment, as a material which configures the seal substrate 1104 having the concave part, it is possible to use a plastic substrate which comprises FRP(Fiberglass-Reinforced Plastics), PVF(PolyVinyl Fluoride), a mylar, polyester or acryl etc. In addition, it is possible to seal by a metal can, to an inside of which a drying agent was glued.

In addition, it is possible to freely combine this embodiment with any one of the embodiment modes 1 through 4, the embodiment 1, or the embodiment 2.

Embodiment 4

In this embodiment, a cross-sectional configuration of one pixel, in particular, shapes of a connection of a light emitting device and TFT, a partition wall which is located between pixels will be described.

Figure 11:
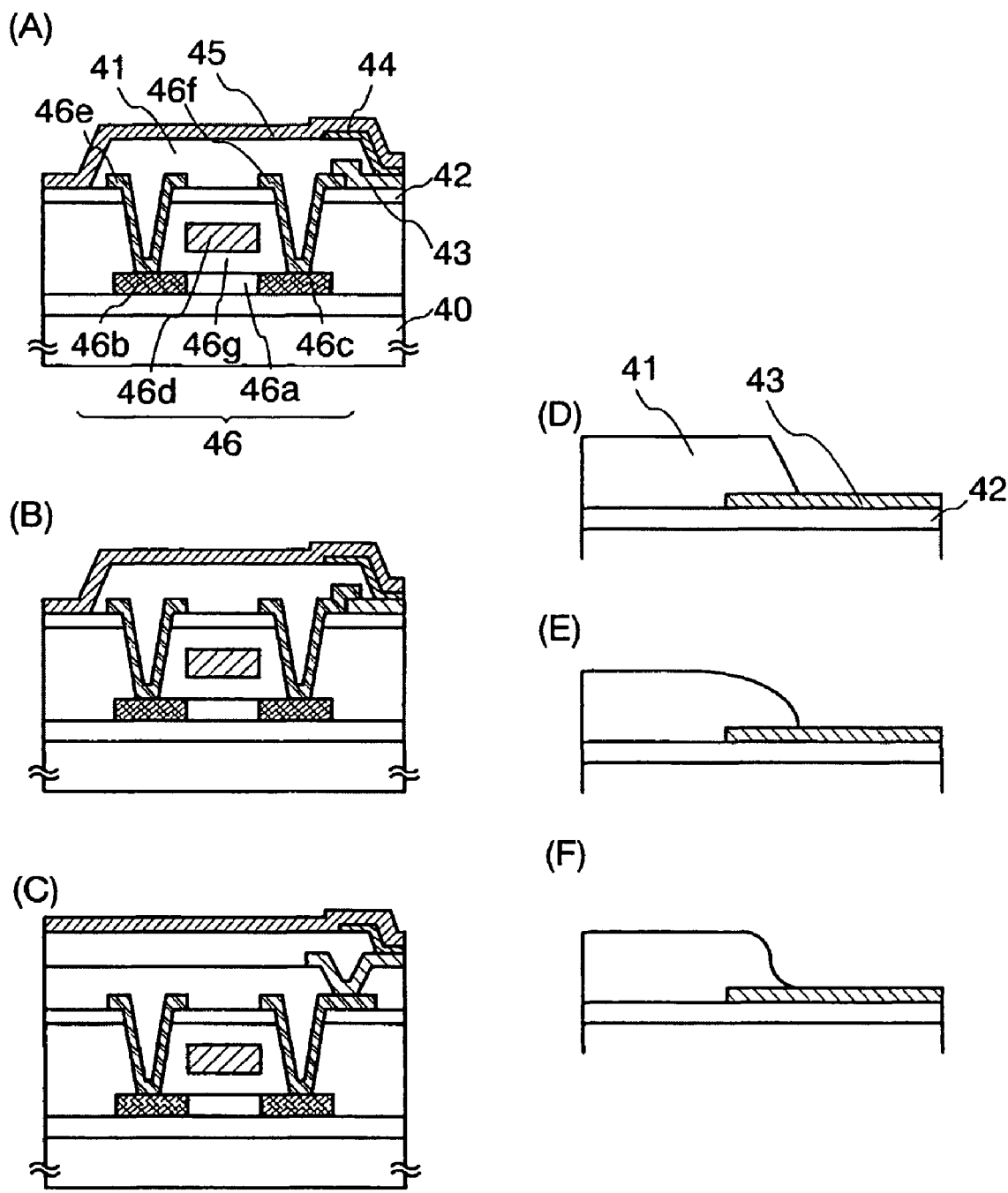
FIGS. 11A to 11F are views showing an embodiment 4.

In FIG. 11(A), 40 designates a substrate, and 41 designates a partition wall (also called as bank), and 42 designates an insulating film, and 43 designates a first electrode (anode), and 44 designates a layer which includes an organic compound, and 45 designates a second electrode (cathode), and 46 designates TFT.

In TFT 46, 46*a* designates a channel forming region, and 46*b*, 46*c* designate a source region or a drain region, and 46 designates a gate electrode, and 46*e*, 46*f* designate a source electrode or a drain electrode. Here, a top-gate type TFT is shown, but it is not restrictive, and an inversely staggered type TFT may also be used, and a forwardly staggered type TFT may also be used. In passing, 46*f* designates an electrode for connecting with TFT 46 by being overlapped with the first electrode 43 partially in contact with it.

In addition, a cross-sectional configuration, which is partially different from FIG. 11(A), is shown in FIG. 11(B).

In FIG. 11(B), an overlapping way of the first electrode and the electrode is different from the configuration of FIG. 11(A), and after the first electrode was patterned, the electrode is formed so as to be partially overlapped, and thereby, it is connected to TFT.

In addition, a cross-sectional configuration, which is partially different from FIG. 11(A), is shown in FIG. 11(C).

In FIG. 11(C), 1 layer of an interlayer insulating film is further disposed, and the first electrode is connected to the electrode of TFT through a contact hole.

In addition, as a cross-sectional shape of the partition wall 41, as shown in FIG. 11(D), it may be made also as a taper shape. It is obtained by etching non-photosensitive organic resin or an inorganic film, after a resist was exposed to light by using a photolithography method.

In addition, if positive type photosensitive organic resin is used, it is possible to make a shape as shown in FIG. 11(E), a shape having a curved surface over a upper end part.

In addition, if negative type photosensitive organic resin is used, it is possible to make a shape as shown in FIG. 11(F), a shape having curved surfaces over a upper end part and a lower end part.

In addition, it is possible to freely combine this embodiment with the embodiment mode 1, the embodiment mode 2, the embodiment mode 3, the embodiment mode 4, the embodiment 1, the embodiment 2, or the embodiment 3.

Embodiment 5

In this embodiment, an example of fabricating a passive matrix type light emitting apparatus (also called as a simple matrix type light emitting apparatus) will be shown.

Firstly, over a glass substrate, a plurality of first wirings are formed in a stripe shape by a material such as ITO (material which becomes an anode). Then, a partition wall, which comprises a resist or photosensitive resin, is formed so as to surround a region which becomes a light emitting region. Then, by a deposition method, a layer which includes an organic compound is formed in a region which was surrounded by the partition wall. In case of realizing full-color display, a material is properly selected, and over introducing monosilane gas, the layer which includes an organic compound is formed by a deposition method. Then, over the partition wall and the layer which includes an organic compound, a plurality of second wirings in a stripe shape are formed by a metal material (material which becomes a cathode) such as Al or Al alloy, so as to be crossed with the plurality of first wirings which comprises ITO. By the above-described processes, it is possible to form a light emitting device in which the layer including an organic compound was used as a light emitting layer.

Then, a seal substrate is glued by a seal member, or sealed by disposing a protective film over the second wiring. As the seal substrate, used is a glass substrate, a plastic substrate which comprises polypropylene, polypropylenesulfide, polycarbonate, polyetherimide, polyphenylenesulfide, polyphenyleneoxide, polysulfone, or polyphtalamide.

Figure 12:
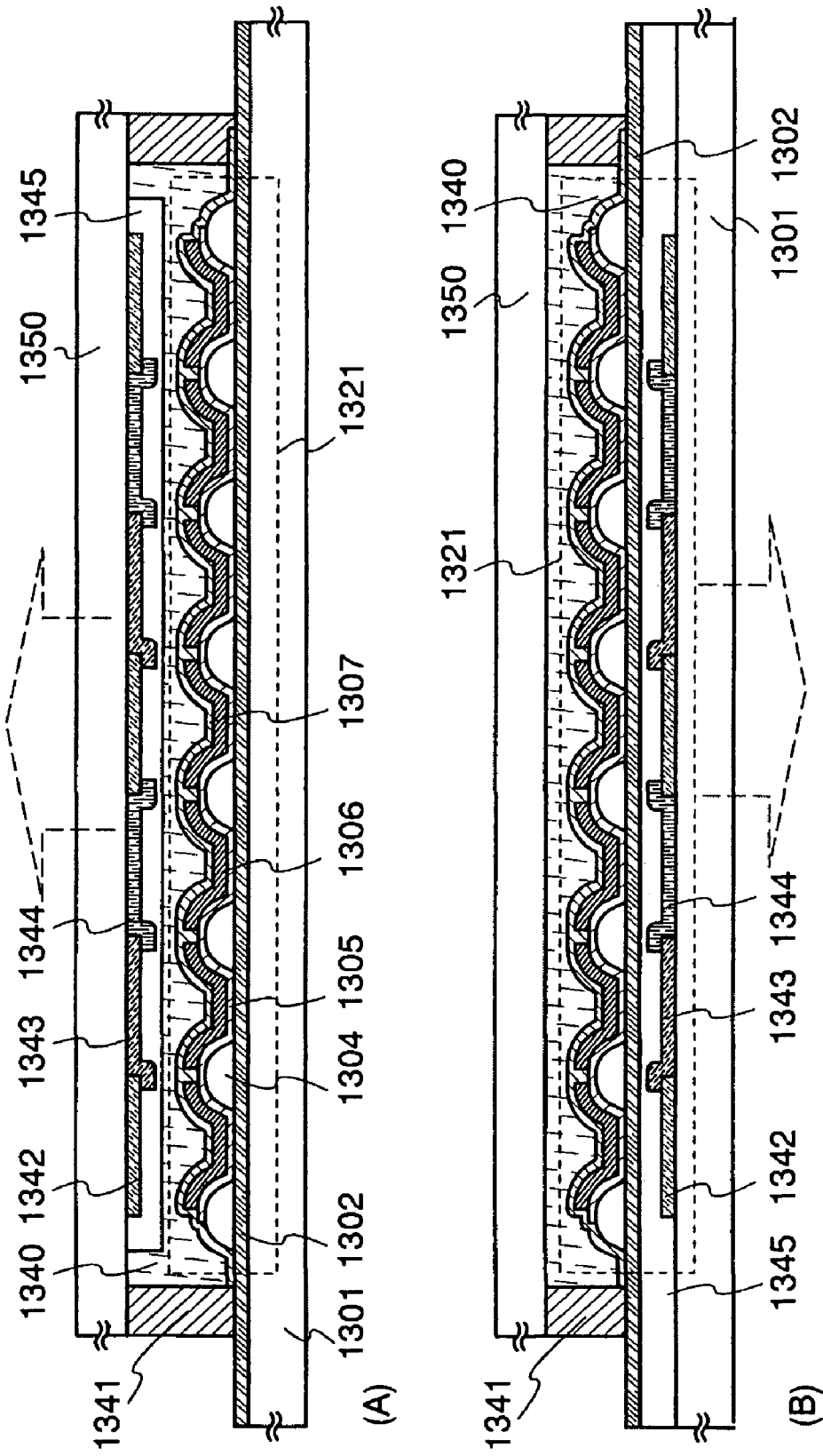
FIGS. 12A and 12B are views showing an embodiment 5.

One example of a cross-sectional view of a display apparatus of this embodiment is shown in FIG. 12(A).

Disposed is a pixel portion 1321 in which a first electrode and a second electrode are crossed over a main surface of a substrate 1300, and a light emitting device was formed at its crossing part. That is, formed is the pixel part 1321 in which luminescent pixels are arranged in a matrix shape. The number of pixels is 640×480 dots in case of VGA specification, 1024×768 dots in case of XGA specification, and 1365×1024 dots in case of SXGA, or 1600×1200 dots in case of UXGA specification, and the number of the first electrodes and the second electrodes are disposed in accordance with it. Further, on a peripheral part of the pixel portion 1321, which is an end part of the substrate 1301, disposed is an input terminal part in which formed was a terminal pad which is connected to an external circuit.

In the display apparatus shown in FIG. 12(A), in the pixel portion, over a main surface of the substrate 1300, formed are a first electrode 1302 which is extended in a left-right direction, a thin film 1305 (since a medium, which emits light by electroluminescence, is included, as a matter of convenience, it is called as EL layer in the following explanation) which includes an illuminant formed over its upper layer, and a second electrode 1306 which is formed over its upper layer and extended in a up-down direction, and over its crossing part, a pixel is formed. That is, by forming the fist electrode 1302 and the second electrode 1306 row-wise and column-wise, pixels are disposed in a matrix shape. An input terminal is formed by the same material as the first electrode or the second electrode. The number of this input terminal is the same number of the first electrode and the second electrode which were disposed row-wise and column-wise.

A cross-sectional shape of the partition wall 1304 has a curved surface shape from a lower end part which is in contact with the first electrode 1302 to a upper end part. The curved surface shape is a shape which has at least one curvature radius, a center of which is located at the partition wall or a lower layer side thereof, or, a shape which has at least one first curvature radium, a center of which is located at a lower end part which is in contact with the first electrode 1302 and at an outside of the partition wall 1304, and at least one second curvature radium, a center of which is located at a upper end part of the partition wall 1304 and at the partition wall or a lower layer side thereof. The cross-sectional shape may be such a thing that curvature is continuously changed from the lower end part of the partition wall 1304 to the upper end part. The EL layer is formed along the curved surface shape, and stress is mitigated by the curved surface shape. That is, in a light emitting device in which different members were laminated, there is such an operation that strain due to its thermal stress is mitigated.

Shown is such a mode that an opposite substrate 1350 for sealing the pixel part 1321 is firmly fixed by a seal member 1341. In a space between the substrate 1301 and the opposite substrate 1350, inert gas may be filled, and an organic resin material 1340 may be encapsulated. In any case, since a light emitting device in the pixel portion 1321 is coated with a barrier insulating film 1307, it is possible to prevent deterioration due to an extrinsic impurity, even if a drying agent is not disposed particularly.

In addition, FIG. 12(A) corresponds to each pixel of the pixel part 1321, and at the opposite substrate 1350 side, formed are single color layers 1342-1344. A planarization layer 1345 prevents a step due to the single color layer. On the other hand, FIG. 12(B) is of such a structure that, at the substrate 1301 side, disposed were the single color layers 1342-1344, and over the planarization film 1345, the first electrode 1302 is formed. In addition, FIG. 12(B) is different from FIG. 12(A) in a light emitting direction. In passing, the same reference numerals are used for the same portions.

In addition, this invention is not restricted to a full-color display apparatus, and can be also implemented for a single color light emitting apparatus, for example, a surface light source, an electric illumination apparatus.

In addition, it is possible to freely combine this embodiment with any one of the embodiment modes 1 through 4, the embodiment 1, or the embodiment 2.

Embodiment 6

Figure 13:
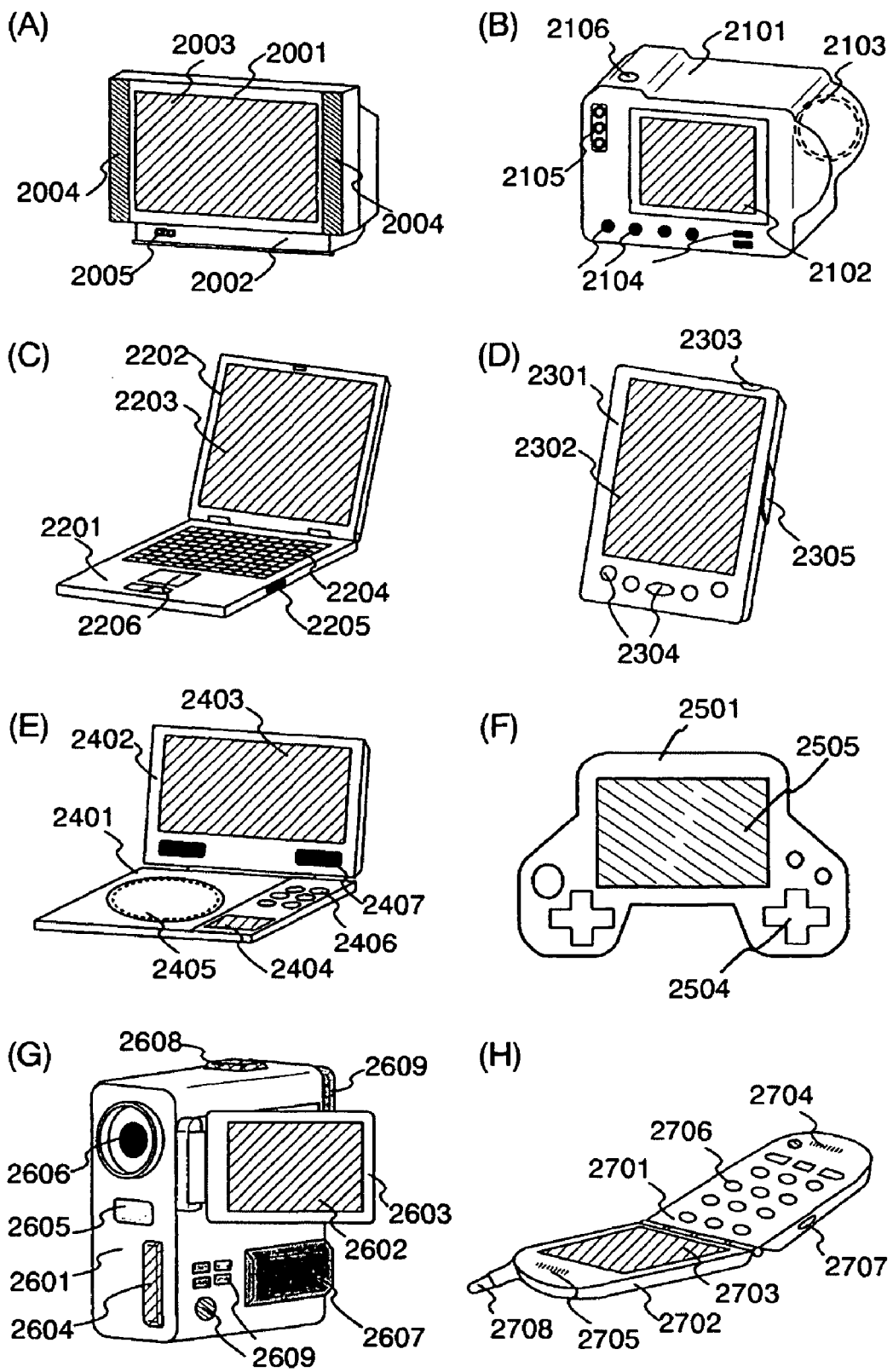
FIGS. 13A to 13H are views showing an embodiment 6.

By incorporating a light emitting apparatus which was obtained by implementing this invention with a display part, it is possible to fabricate an electronic equipment. As the electronic equipment, cited are a video camera, a digital camera, a goggle type display (headmount display), a navigation system, a sound reproducing apparatus (car audio, audio component stereo etc.), a notebook type personal computer, a game equipment, a portable information terminal (mobile computer, portable telephone, portable type game machine or electronic book etc.), an image reproducing apparatus which had a recording medium (concretely speaking, an apparatus which reproduces a recording medium such as Digital Versatile Disc (DVD), and had a display which can display its image) and so on. Concrete examples of those electronic equipments are shown in FIG. 13.

FIG. 13(A) shows a television, which includes a housing 2001, a support table 2002, a display part 2003, a speaker part 2004, a video input terminal 2005, and so on. This invention is applicable to the display part 2003. In passing, all information display televisions, such as personal computer use, TV broadcasting receiving use, and advertisement display use, are included.

FIG. 13(B) shows a digital camera, which includes a main body 2101, a display part 2102, an image receiving part 2103, an operating key 2104, an external connection port 2105, a shutter 2106, and so on. This invention is applicable to the display part 2102.

FIG. 13(C) shows a notebook type personal computer, which includes a main body 2201, a housing 2202, a display part 2203, a keyboard 2204, an external connection port 2205, a pointing mouse 2206, and so on. This invention is applicable to the display part 2203.

FIG. 13(D) shows a mobile computer, which includes a main body 2301, a display part 2302, a switch 2303, an operating key 2304, an infrared port 2305, and so on. This invention is applicable to the display part 2302.

FIG. 13(E) shows a portable type image reproducing apparatus (concretely speaking, DVD reproducing apparatus) which had a recording medium, which includes a main body 2401, a housing 2402, a display part A 2403, a display part B 2404, a recording medium (DVD etc.) reading part 2405, an operating key 2406, a speaker part 2407, and so on. The display part A 2403 displays mainly image information, and the display part B 2404 displays mainly textual information, and this invention is applicable to the display parts A, B, 2403, 2404. In passing, a home-use game equipment etc. are also included in the image reproducing apparatus which had a recording medium.

FIG. 13(F) shows a game equipment, which includes a main body 2501, a display part 2505, an operating switch 2504, and so on.

FIG. 13(G) shows a video camera, which includes a main body 2601, a display part 2602, a housing 2603, an external connection port 2604, a remote controller receiving part 2605, an image receiving part 2606, a battery 2607, a sound input part 2608, an operating key 2609, and so on. This invention is applicable to the display part 2602.

FIG. 13(H) shows a portable telephone, which includes a main body 2701, a housing 2702, a display part 2703, a sound input part 2704, a sound output part 2705, an operating key 2706, an external connection port 2707, an antenna 2708, and so on. This invention is applicable to the display part 2703. In passing, by displaying a white color character on a black color background on the display part 2703, it is possible to suppress a consumption current of a portable telephone.

As above, a display apparatus which was obtained by implementing this invention may be used as a display part of every electronic equipment. In passing, in the electronic equipment of this embodiment mode, a light emitting apparatus, which was fabricated by using either configuration of the embodiment modes 1 through 4, the embodiments 1 through 5, may be used.

Embodiment 7

Figure 14:
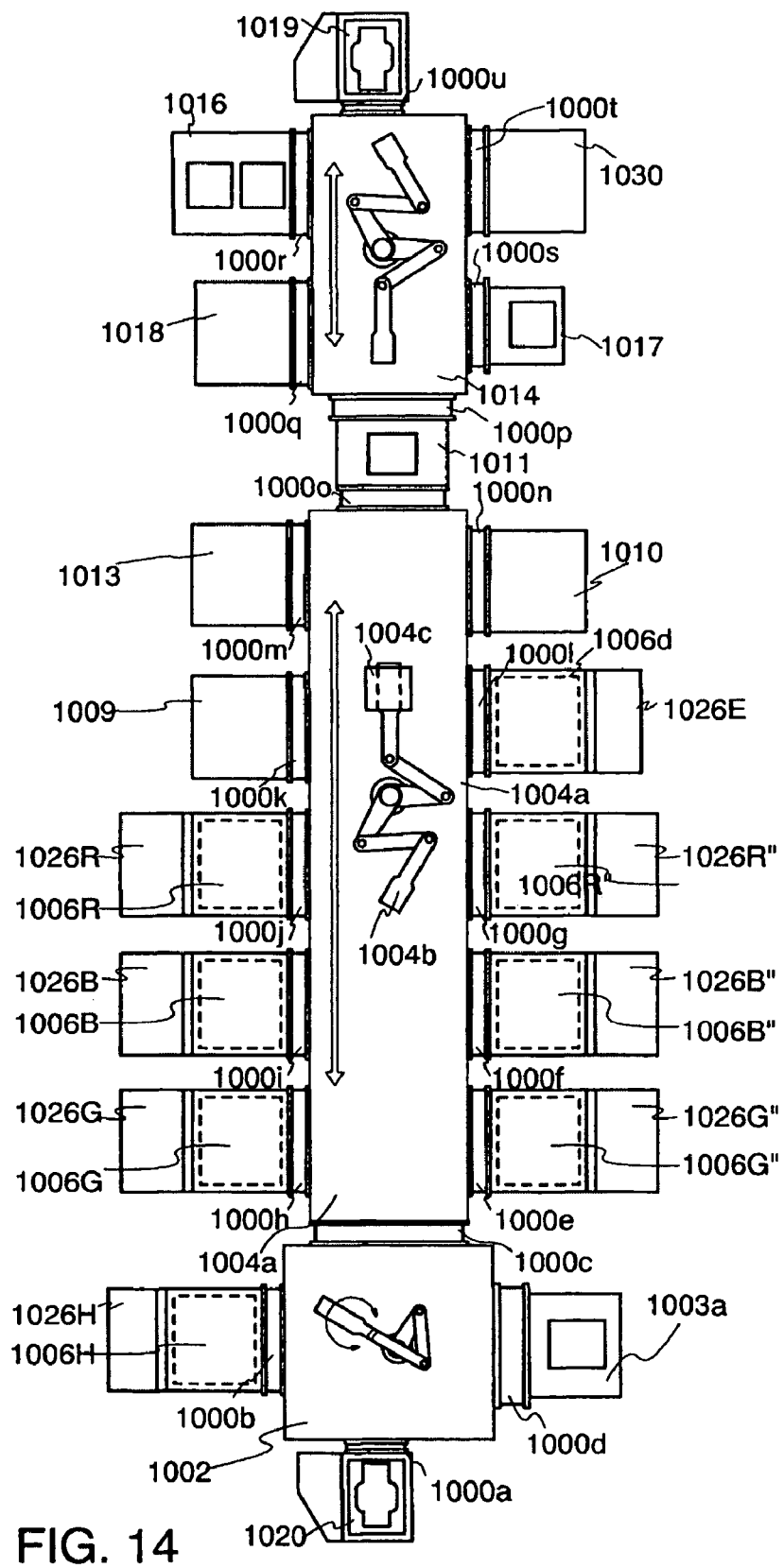
FIG. 14 is a view showing an inline system manufacturing apparatus showing an embodiment 7.

In this embodiment, an example of an inline type manufacturing apparatus, in which fabrications from a first electrode up to sealing were totally automated, is shown in FIG. 14

FIG. 14 shows an inline type manufacturing apparatus which has gates 1000a-1000u, transfer chambers 1002, 1004a, 1014, a hand-over chamber 1011, a first film forming chamber 1006H, a second film forming chamber 1006B, a third film forming chamber 1006G, a fourth film forming chamber 1006R, a fifth film forming chamber 1006E, an auxiliary film forming chamber 1006G", an auxiliary film forming chamber 1006R", an auxiliary film forming chamber 1006B", other film forming chambers 1009, 10010, 1013, installation chambers in which deposition sources are installed 1026R, 1026G, 1026B, 1026R", 1026G", 1026B", 1026E, 1026H, a pretreatment chamber 1003a, a sealing chamber 1018, a sealing chamber 1016, a seal substrate stock chamber 1030, a substrate carry-in chamber 1020, and a pull-out chamber 1019. In passing, in the transfer chamber 1004a, disposed is a transfer mechanism 1004b which has a plurality of arms for transferring or inverting the substrate 1004c, and in other transfer chambers, transfer mechanisms are disposed, respectively, in the same manner.

Hereinafter, a procedure for carrying a substrate, on which an anode (first electrode) and an insulator (partition wall) for covering an end part of the anode were disposed in advance, in the manufacturing apparatus shown in FIG. 14, to fabricate a light emitting apparatus will be shown.

Firstly, in the substrate carry-in chamber 1020, the above-described substrate is set. Ii is designed to be able to correspond to such a case that the substrate is a large size substrate (e.g., 600 mm×720 mm), and such a case that it is a normal substrate (e.g., 127 mm×127 mm). The substrate carry-in chamber 1020 is coupled to a vacuum pumping processing chamber, and it is desirable that, after vacuum pumping was carried out, inert gas is introduced, and atmospheric pressure is realized.

The substrate (substrate on which an anode, and an insulator for covering an end part of the anode were disposed), which was set to the substrate carry-in chamber, is transferred to the transfer chamber 1002. In order that moisture and oxygen do not exist in the transfer chamber 1002 to the utmost, it is preferable that it has been vacuated in advance and vacuum has been maintained.

In addition, before it is set to the cassette chamber, for the purpose of reducing point defects, it is preferable to clean a surface of a first electrode (anode) by a porous sponge (representatively, made by PVA (polyvinyl alcohol), made by nylon, etc.) in which a surface-active agent (alkalescent) was contained, and to remove dusts over the surface. In addition, before a layer which includes an organic compound is formed, in order to remove moisture and other gas which are included in the above-described substrate, it is preferable to carry out anneal for deairing in vacuum, and anneal may be carried out in the transfer chamber 1002, or the pretreatment chamber 1003a.

In addition, in the substrate transfer mechanism which was disposed in the transfer chamber 1002, a substrate inverting mechanism is provided, and it is possible to inverse the substrate properly.

In addition, as for the above-described vacuum pumping processing chamber, a magnetic levitation type turbo molecular pump, a cryopump, or a dry pump is provided.

In addition, in case that it is intended to remove a film which was formed at a unnecessary place and includes an organic compound, it is transferred to the pretreatment chamber 1003a, and a laminated layer of an organic compound film may be selectively removed. The pretreatment chamber 1003a has plasma generating means, and by exciting one kind or plural kinds of gasses, which were selected from Ar, H, F, and O to generate plasma, dry etching is carried out. In addition, in order that ultraviolet ray irradiation can be carried out as anode surface treatment, a UV irradiation mechanism may be provided in the pretreatment chamber 1003a.

In addition, in order to eliminate shrink, it is desirable to carry out vacuum heating right before deposition of a film which includes an organic compound, and in order to completely remove moisture and other gas which are included in the above-described substrate, in the transfer chamber 1002, anneal for deairing is carried out in vacuum ($5 \times 10^{-3}$ Torr (0.665 Pa) or less, preferably, $10^{-4}$-$10^{-6}$ Torr).

Then, after the above-described vacuum heating was carried out, it is transferred to the film forming chamber 1006H, and deposition is carried out. Then, the substrate is properly transferred from the transfer chamber 1002 to the film forming chambers 1006R, 1006G, 1006B, 1006R", 1006G", 1006B", 1006E which were coupled to the transfer chamber 1004a, and an organic compound layer, which becomes a hole injection layer, a hole transport layer, a light emitting layer, an electron transport layer, or an electron injection layer and which is composed of low molecules, is properly formed.

In addition, a film forming chamber for forming a hole injection layer, which is composed of a polymeric material, by an ink-jet method and a spin coating method etc. may be disposed separately. In addition, the substrate is placed vertically, and a film may be formed by an ink-jet method in vacuum.

In addition, in case that PEDOT/PSS was formed as a film by a spin coat method, since a film is formed over an entire surface, it is desirable to selectively remove an end surface and a peripheral part of a substrate, a terminal part, a connection region of a cathode and a lower part wiring, and so on, and it is desirable to remove by $O_2$ ashing etc. in the pretreatment chamber 1003a.

Here, the film forming chambers 1006R, 1006G, 1006B, 1006R", 1006G", 1006B", 1006E, 1006H will be described.

In each film forming chamber 1006R, 1006G, 1006B, 1006R", 1006G", 1006B", 1006E, 1006H, a movable deposition source holder (deposition cell) is installed. That is, it corresponds to the film forming chamber of the above-described embodiment mode 2, which was shown in FIG. 2. As shown in the above-described embodiment mode 2, deposition is carried out over introducing material gas on the occasion of deposition. As the material gas, concretely speaking, one kind or a plurality of kinds, which were selected from silane series gas (monosilane, disilane, trisilane etc.), $SiF_4$, $GeH_4$, $GeF_4$, $SnH_4$, or hydro carbon series gas ($CH_4$, $C_2H_2$, $C_2H_4$, $C_6H_6$ etc.), may be used. By intentionally introducing material gas at the time of film formation, and by having a component of the material gas included in an organic compound film, it is possible to make a high-density film. By having a component of a material gas included in an organic compound film, it is possible to block an impurity such as oxygen and moisture which causes deterioration from being intruded, diffused in a film, and to improve reliability of a light emitting device.

In passing, as to this deposition source holder, a plurality of them are prepared, and a plurality of containers (crucibles) in which EL materials were sealed are properly provided, and they are disposed in the film forming chamber in this state. By setting a substrate by a face-down system, and by carrying out positional alignment of a deposition mask by CCD etc., and by carrying out deposition by a resistance heating method, it is possible to carry out film formation selectively. In passing, a mask stock chamber for storing a deposition mask may be disposed.

For installation of EL materials in these film forming chambers, it is preferable to use the manufacturing system which was shown in FIG. 7, FIG. 8 of the above-described embodiment 1. That is, it is preferable to carry out film formation by using a container (representatively, crucible) in which an EL material has been accommodated in advance by a material maker. Further, on the occasion of installation, it is preferable to carry out without contact with atmospheric air, and on the occasion that it is transferred from a material maker, it is preferable to be introduced into the film forming chamber, in a state that the crucible is sealed hermetically in a second container. Preferably, the installation chambers 1026R, 1026G, 1026B, 1026R", 1026G", 1026B", 1026H, 1026E having vacuum pumping means coupled to each film forming chamber 1006R, 1006G, 1006B, 1006R", 1006G", 1006B", 1006E, 1006H are made to form vacuum or, inert gas atmosphere, and in this state, the crucible is pulled out from the second container, and the crucible is installed in the film forming chamber.

By doing this, it is possible to prevent a crucible, and an EL material, which was accommodated in the crucible, from being contaminated. In passing, it is possible to stock metal masks in the installation chambers 1026R, 1026G, 1026B, 1026R", 1026G", 1026B", 1026H, 1026E.

By properly selecting EL materials which are placed in the film forming chambers 1006R, 1006G, 1006B, 1006R", 1006G", 1006B", 1006E, 1006H, as an entire light emitting device, it is possible to form a light emitting device which indicates light emission of a single color (concretely, white color), or full color (concretely, red color, green color, blue color). For example, in case of forming a green color light emitting device, if a cathode is formed, after a hole transport layer or a hole injection layer in the film forming chamber 1006H, and a light emitting layer (G) in the film forming chamber 1006G, and an electron transport layer or an electron injection layer in the film forming chamber 1006E were sequentially laminated, it is possible to obtain the green color light emitting device. For example, in case of forming a full color light emitting device, using a deposition mask for R in the film forming chamber 1006R, a hole transport layer or a hole injection layer, a light emitting layer (R), an electron transport layer or an electron injection layer are sequentially laminated, and using a deposition mask for G in the film forming chamber 1006G, a hole transport layer or a hole injection layer, a light emitting layer (G), an electron transport layer or an electron injection layer are sequentially laminated, and using a deposition mask for B in the film forming chamber 1006B, a hole transport layer or a hole injection layer, a light emitting layer (B), an electron transport layer or an electron injection layer are sequentially laminated, it is possible to obtain the full color light emitting device.

In addition, by utilizing the auxiliary film forming chambers 1006R", 1006G", 1006B", without stopping a line even during such a period that cleaning is carried out in the film forming chambers 1006R, 1006G, 1006B, it is possible to fabricate a panel. In addition, it is possible to increase the number of panels by activating both sides.

By the above-described process, layers which include organic compounds were laminated properly, and thereafter, by the transfer mechanism which is disposed in the transfer chamber 1004a, the substrate is transferred to the film forming chamber 1010, and a cathode is formed. This cathode is a metal film (alloy such as MgAg, MgIn, $CaF_2$, LiF, CaN, or a film formed by a co-deposition method of an element which belongs to a 1 family or a 2 family of the periodic table and aluminum, or a laminated film of these) which is formed by a deposition method which used resistance heating. In addition, a cathode may be formed by using a sputtering method.

In addition, in case of fabricating a upper surface launching type light emitting device, it is desirable that a cathode is transparent or semi-transparent, and it is desirable that a thin film (1 nm-10 nm) of the above-described metal film, or a laminated layer of a thin film (1 nm-10 nm) of the above-described metal film and a transparent conductive film is used as the cathode. In this case, by using a sputter method, a film, which comprising a transparent conductive film (ITO(indium oxide-tin oxide alloy), indium oxide-zinc oxide alloy ($In_2O_3$—ZnO), zinc oxide (ZnO) etc.), may be formed in the film forming chamber 1009.

By the above-described processes, a light emitting device of a laminated layer configuration is formed.

In addition, it may be designed that it is transferred to the film forming chamber 1013 which was coupled to the transfer chamber 1004a, and a protective film, which comprises a silicon nitride film, or a silicon nitride oxide film, is formed for sealing. Here, in the film forming chamber 1013, a target which comprises silicon, or a target which comprises silicon oxide, or a target which comprises silicon nitride, is provided. For example, using the target which comprises silicon, by changing film forming chamber atmosphere to nitrogen atmosphere or atmosphere which includes nitrogen and argon, it is possible to form a silicon nitride film on a cathode. In addition, it may be formed by use of a thin film in which carbon is a major component (a DLC film, a CN film, an amorphous carbon film) as a protective film, and a film forming chamber which used a CVD method may be disposed separately.

Then, a substrate, on which a light emitting device was formed, is transferred from the transfer chamber 1004a to the hand-over chamber 1011, without contact with atmospheric air, and further, transferred from the hand-over chamber 1011 to the transfer chamber 1014. Then, the substrate, on which a light emitting device was formed, is transferred from the transfer chamber 1014 to the sealing chamber 1016.

A seal substrate is set from outside to the load chamber 1017, and prepared. In passing, in order to remove an impurity such as moisture, it is preferable to carry out anneal in advance in vacuum. And, in case of forming a seal member for gluing the substrate on which a light emitting device was formed with the seal substrate, the seal member is formed in the sealing chamber, and the seal substrate, on which the seal member was formed, is transferred to the seal substrate stock chamber 1030. In passing, in the sealing chamber 1018, a drying agent may be disposed on the seal substrate. In passing, here, an example, in which the seal member was formed on the seal substrate, was shown, but in particular, it is not restrictive, and the seal member may be formed on the substrate on which a light emitting device was formed.

Then, the sealing chamber 1016, the substrate and the seal substrate are glued together, and UV rays are irradiated to a pair of the glued substrates by a ultraviolet ray irradiating mechanism which was disposed in the sealing chamber 1016, to cure the seal member. In passing, here, as the seal member, ultraviolet ray cured resin was used, but if it is an adhesive agent, it is not particularly restrictive.

Then, the pair of glued substrates are transferred from the sealing chamber 1016 to the transfer chamber 1014, and then, from the transfer chamber 1014 to the pull-out chamber 1019, and then, pulled out.

As above, by using the manufacturing apparatus shown in FIG. 14, until a light emitting device is completely sealed in a hermetically enclosed space, it is not needed to be exposed to atmospheric air, and therefore, it becomes possible to fabricate a light emitting apparatus with high reliability. In passing, in the transfer chambers 1014, vacuum, and nitrogen atmosphere with atmospheric pressure are repeated, but it is desired that vacuum is maintained on a steady basis in the transfer chambers 1002, 1004a.

In passing, although it is not shown in the figure here, disposed is a control control apparatus for realizing automation by controlling a path through which the substrate is moved to an individual processing chamber.

In addition, in the manufacturing apparatus shown in FIG. 14, the substrate, on which a transparent conductive film (or a metal film (TiN)) was disposed as an anode, is carried in, and a layer including an organic compound was formed, and thereafter, a transparent or semi-transparent cathode (e.g., a laminated layer of a thin metal film (Al, Ag) and a transparent conductive film) is formed, and thereby, it is also possible to form a upper surface launching type light emitting device.

In addition, in the manufacturing apparatus shown in FIG. 14, the substrate, on which a transparent conductive film was formed as an anode, is transferred, and after a layer including an organic compound was formed, a cathode, which comprises a metal film (Al, Ag), is formed, and thereby, it is also possible to form a lower surface launching type light emitting device.

In addition, it is possible to freely combine this embodiment with any one of the embodiment modes 1 through 4, the embodiment 1.

INDUSTRIAL APPLICABILITY

According to this invention, it is possible to form a high-density organic compound layer, by carrying out deposition of an organic compound film over introducing material gas, and by having a component of the material gas included in the organic compound film, and by carrying out film formation up to a desired film thickness. According to this invention, by intentionally introducing material gas at the time of film formation, a high-density film is realized, and an impurity such as oxygen and moisture, which causes deterioration, is blocked from being intruded, or diffused in a film.

The invention claimed is:

1. A light emitting apparatus comprising a light emitting device comprising:
 an anode over a substrate having an insulation surface;
 an EL layer which is in contact with the anode; and
 a cathode which is in contact with the EL layer,
 wherein the EL layer includes an organic compound in which electro luminescence is obtained, and
 wherein the EL layer includes silicon, with $1\times10^{18}$-$5\times10^{20}$ atoms/cm$^3$ by SIMS measurement.

2. The light emitting apparatus according to claim 1, wherein the silicon is included as silane.

3. The light emitting apparatus according to claim 1, wherein the silicon is included as silicon oxide.

4. The light emitting apparatus according to claim 1, wherein the electro luminescence is fluorescence.

5. The light emitting apparatus according to claim 1, wherein the organic compound is one selected from the group consisted of a metal complex including a quinoline structure, a metal complex including a benzoxazole structure, and a metal complex including a benzothiazole structure.

6. The light emitting apparatus according to claim 1, further comprising a thin film transistor over the substrate and electrically connected to the anode.

7. A light emitting apparatus comprising a light emitting device comprising:
 an anode over a substrate having an insulation surface,
 an EL layer which is in contact with the anode; and
 a cathode which is in contact with the EL layer,
 wherein the EL layer includes a host material and a dopant material,
 wherein the dopant material is an organic compound in which electro luminescence is obtained, and
 wherein the EL layer includes silicon, with $1\times10^{18}$-$5\times10^{20}$ atoms/cm$^3$ by SIMS measurement.

8. The light emitting apparatus according to claim 7, wherein the silicon is included as silane.

9. The light emitting apparatus according to claim 7, wherein the silicon is included as silicon oxide.

10. The light emitting apparatus according to claim 7, wherein the electro luminescence is fluorescence.

11. The light emitting apparatus according to claim 7, wherein the organic compound is one selected from the group consisted of a metal complex including a quinoline structure, a metal complex including a benzoxazole structure, and a metal complex including a benzothiazole structure.

12. The light emitting apparatus according to claim 7, further comprising a thin film transistor over the substrate, electrically connected to the anode.

13. A light emitting apparatus comprising a light emitting device comprising:
 an anode over a substrate having an insulation surface,
 an EL layer which is in contact with the anode; and
 a cathode which is in contact with the EL layer,
 wherein the EL layer comprises:
  a hole injection layer in contact with the anode;
  a light emitting layer over the hole injection layer including an organic compound in which electro luminescence is obtained; and
  an electron injection layer over the light emitting layer, and
 wherein the light emitting layer includes silicon, with $1\times10^{18}$-$5\times10^{20}$ atoms/cm$^3$ by SIMS measurement.

14. The light emitting apparatus according to claim 13, wherein the silicon is included as silane.

15. The light emitting apparatus according to claim 13, wherein the silicon is included as silicon oxide.

16. The light emitting apparatus according to claim 13, wherein the electro luminescence is fluorescence.

17. The light emitting apparatus according to claim 13, wherein the organic compound is one selected from the group consisted of a metal complex including a quinoline structure, a metal complex including a benzoxazole structure, and a metal complex including a benzothiazole structure.

18. The light emitting apparatus according to claim 13, further comprising a thin film transistor over the substrate, electrically connected to the anode.

19. A light emitting apparatus comprising a light emitting device comprising:
- an anode over a substrate having an insulation surface,
- an EL layer which is in contact with the anode; and
- a cathode which is in contact with the EL layer,
- wherein the EL layer comprises:
  - a hole injection layer in contact with the anode;
  - a hole transport layer over the hole injection layer;
  - a light emitting layer over the hole transport layer, including an organic compound in which electro luminescence is obtained;
  - a electron transport layer over the light emitting layer; and
  - an electron injection layer over the electron transport layer, and
- wherein the light emitting layer includes silicon, with $1\times10^{18}$-$5\times10^{20}$ atoms/cm$^3$ by SIMS measurement.

20. The light emitting apparatus according to claim 19, wherein the silicon is included as silane.

21. The light emitting apparatus according to claim 19, wherein the silicon is included as silicon oxide.

22. The light emitting apparatus according to claim 19, wherein the electro luminescence is fluorescence.

23. The light emitting apparatus according to claim 19, wherein the organic compound is one selected from the group consisted of a metal complex including a quinoline structure, a metal complex including a benzoxazole structure, and a metal complex including a benzothiazole structure.

24. The light emitting apparatus according to claim 19, further comprising a thin film transistor over the substrate, electrically connected to the anode.

25. A light emitting apparatus comprising a light emitting device comprising:
- an anode over a substrate having an insulation surface,
- an EL layer which is in contact with the anode; and
- a cathode which is in contact with the EL layer,
- wherein the EL layer comprises:
  - a first functional region over the anode, including a first compound;
  - a second functional region in contact with the first functional region, including a second organic compound in which electro luminescence is obtained; and
  - a mixed region between the first functional region and the second functional region, including the first compound and the second organic compound, and
- wherein the mixed region includes silicon, with $1\times10^{18}$-$5\times10^{20}$ atoms/cm$^3$ by SIMS measurement.

26. The light emitting apparatus according to claim 25, wherein the silicon is included as silane.

27. The light emitting apparatus according to claim 25, wherein the silicon is included as silicon oxide.

28. The light emitting apparatus according to claim 25, wherein the electro luminescence is fluorescence.

29. The light emitting apparatus according to claim 25, wherein the second organic compound is one selected from the group consisted of a metal complex including a quinoline structure, a metal complex including a benzoxazole structure, and a metal complex including a benzothiazole structure.

30. The light emitting apparatus according to claim 25, further comprising a thin film transistor over the substrate, electrically connected to the anode.

* * * * *